(12) United States Patent
Tanaka et al.

(10) Patent No.: US 12,294,019 B2
(45) Date of Patent: May 6, 2025

(54) METHOD FOR MANUFACTURING NITRIDE SEMICONDUCTOR DEVICE AND NITRIDE SEMICONDUCTOR DEVICE

(71) Applicant: FUJI ELECTRIC CO., LTD., Kawasaki (JP)

(72) Inventors: Ryo Tanaka, Tokyo (JP); Yuki Ohuchi, Tokyo (JP); Katsunori Ueno, Nagano (JP); Shinya Takashima, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 529 days.

(21) Appl. No.: 17/582,710

(22) Filed: Jan. 24, 2022

(65) Prior Publication Data

US 2022/0285503 A1 Sep. 8, 2022

(30) Foreign Application Priority Data

Mar. 8, 2021 (JP) .................................. 2021-36613

(51) Int. Cl.
*H01L 29/20* (2006.01)
*H01L 21/02* (2006.01)
*H01L 21/265* (2006.01)

(52) U.S. Cl.
CPC .... *H01L 29/2003* (2013.01); *H01L 21/02389* (2013.01); *H01L 21/26546* (2013.01)

(58) Field of Classification Search
CPC ............. H01L 29/2003; H01L 29/0619; H01L 29/1095; H01L 29/7802; H01L 29/7813;
(Continued)

(56) References Cited

U.S. PATENT DOCUMENTS 8,624,264 B2   1/2014 Shimizu et al.
9,269,577 B2   2/2016 Iwami
(Continued)

FOREIGN PATENT DOCUMENTS

JP   2012-186324 A   9/2012
JP    201486698 A    5/2014
(Continued)

OTHER PUBLICATIONS

Kumar et.al., "Atomic-scale quantitative analysis of implanted Mg in annealed GaN layers on free-standing GaN substrates", Journal of Applied Physics, 126, 235704, 2019, 9 pages.
(Continued)

*Primary Examiner* — Shaun M Campbell

(57) ABSTRACT

A method for manufacturing a nitride semiconductor device including: forming N-type regions in a nitride semiconductor layer; implanting ions of an acceptor element into a region sandwiched by the N-type regions in the nitride semiconductor layer; and forming a P-type region sandwiched by the N-type regions by subjecting the nitride semiconductor layer to heat treatment and activating the acceptor element. The forming the N-type regions includes implanting ions of a donor element to the nitride semiconductor layer such that concentration of the donor element in the N-type regions is equal to or greater than concentration of the acceptor element in the P-type region. The implanting ions of the acceptor element includes implanting ions of the acceptor element such that concentration of the acceptor element in the P-type region is $1\times10^{19}$ cm$^{-3}$ or more and $1\times10^{21}$ cm$^{-3}$ or less.

13 Claims, 21 Drawing Sheets

(58) Field of Classification Search
CPC ............... H01L 29/8611; H01L 29/872; H01L 21/02389; H01L 21/26546; H01L 21/28575
See application file for complete search history.

(56) References Cited

U.S. PATENT DOCUMENTS

| | | | |
|---|---|---|---|
| 10,903,352 | B2 | 1/2021 | Takashima et al. |
| 2012/0228630 | A1 | 9/2012 | Shimizu et al. |
| 2013/0344667 | A1* | 12/2013 | Qin ................... H01L 29/7813 438/270 |
| 2014/0120703 | A1 | 5/2014 | Iwami |
| 2019/0157448 | A1 | 5/2019 | Takashima et al. |
| 2019/0165166 | A1* | 5/2019 | Kinoshita ......... H01L 29/66068 |
| 2021/0043737 | A1* | 2/2021 | Takashima .......... H01L 29/7802 |
| 2021/0134988 | A1* | 5/2021 | Kuo .................. H01L 29/7371 |

FOREIGN PATENT DOCUMENTS

| | | | |
|---|---|---|---|
| JP | 201996744 A | 6/2019 | |
| JP | 2019-192687 A | 10/2019 | |
| WO | WO-2014083771 A1 * | 6/2014 | ......... H01L 29/0623 |
| WO | 2019/077878 A1 | 4/2019 | |

OTHER PUBLICATIONS

H. Sakurai et.al., "Highly effective activation of Mg-implanted p-type GaN by ultra-high-pressure annealing", Applied Physics Letters, 115, 142104, 2019, 6 pages.

G. Miceli and A. Pasquarello, "Self-compensation due to point defects in Mg-doped GaN", Physical Review B., vol. 93, No. 16, 2016, 11 pages.

Japanese Office Action issue in counterpart Japanese Application No. 2021-036613 dated Dec. 10, 2024.

* cited by examiner

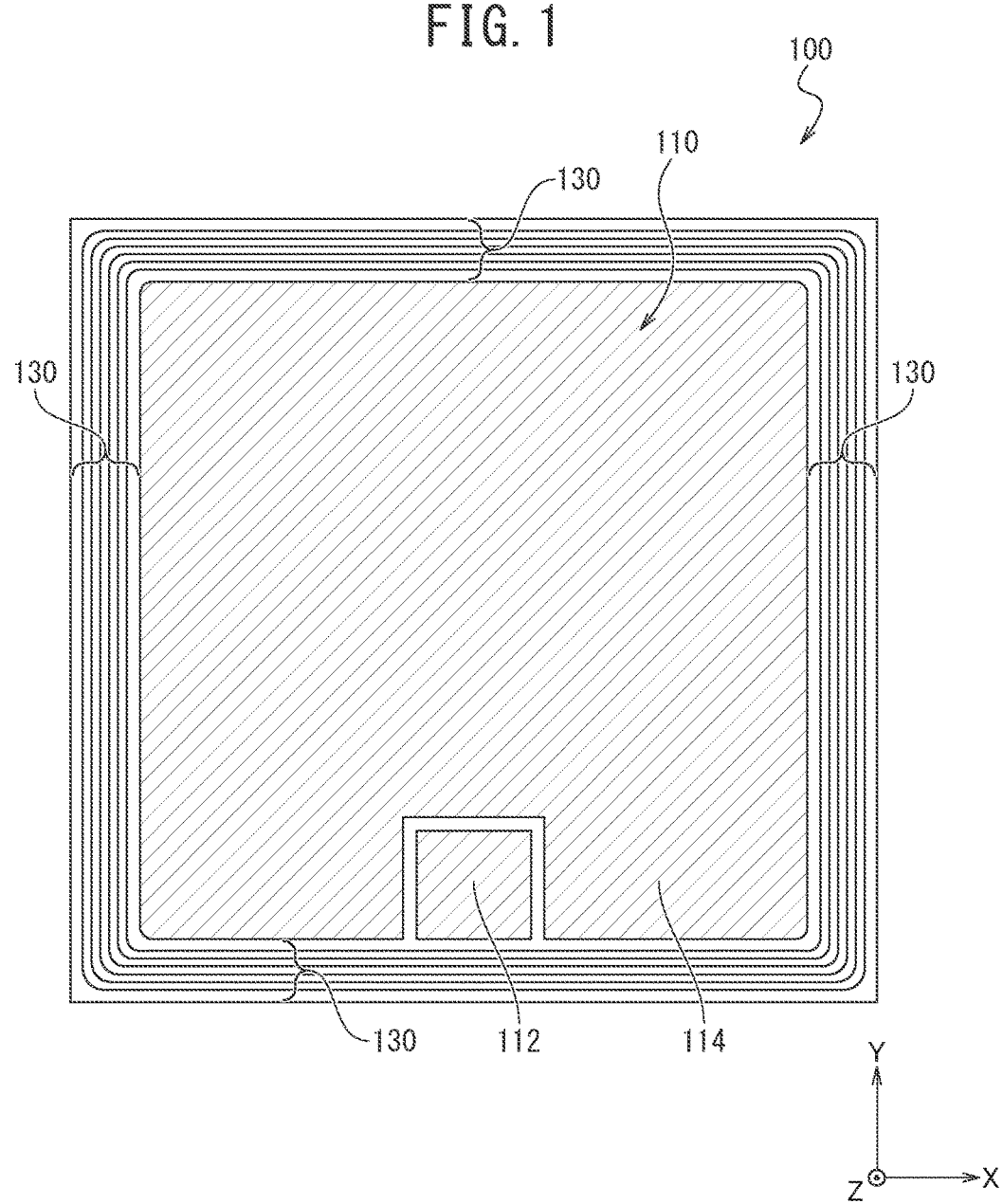

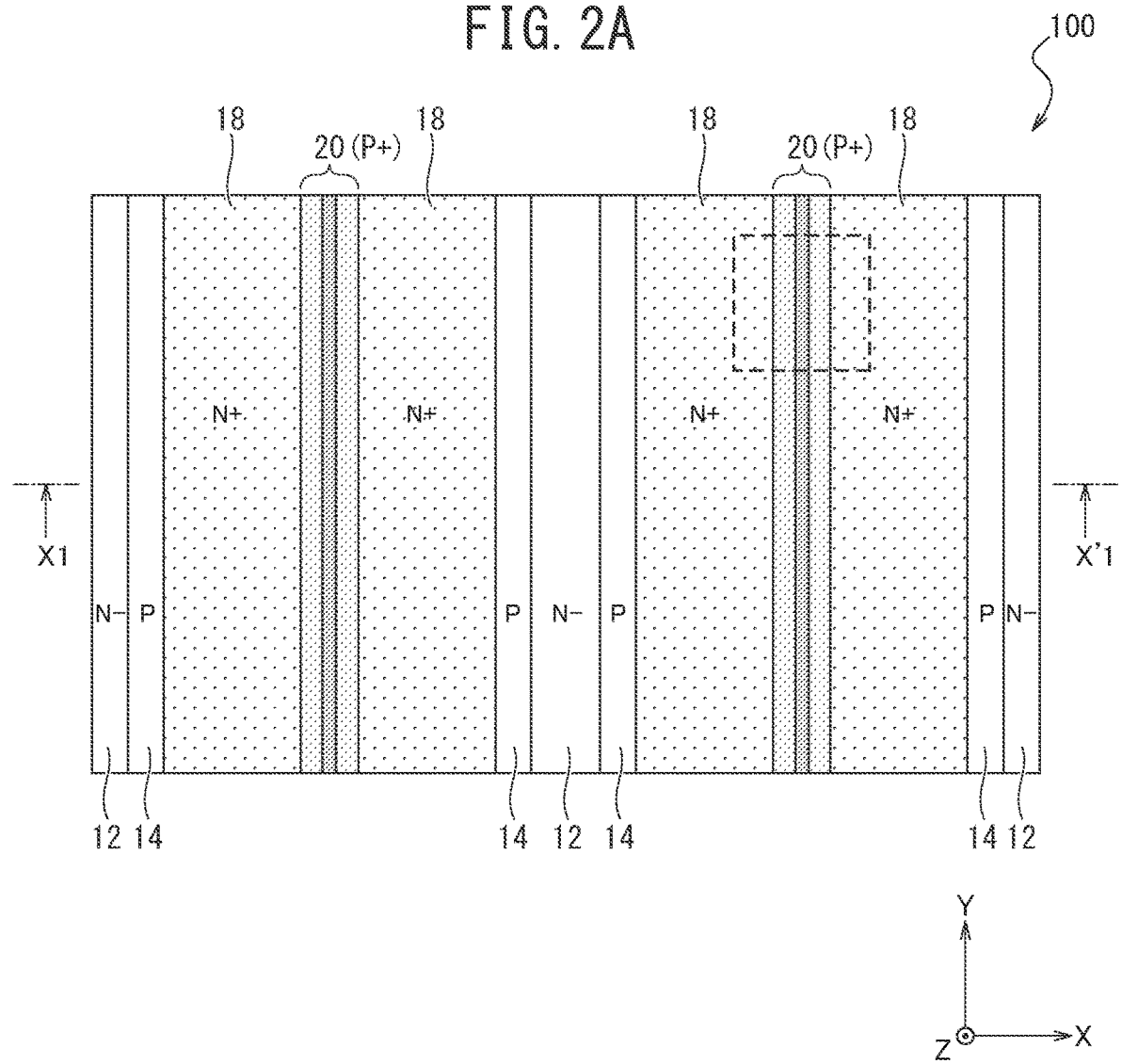

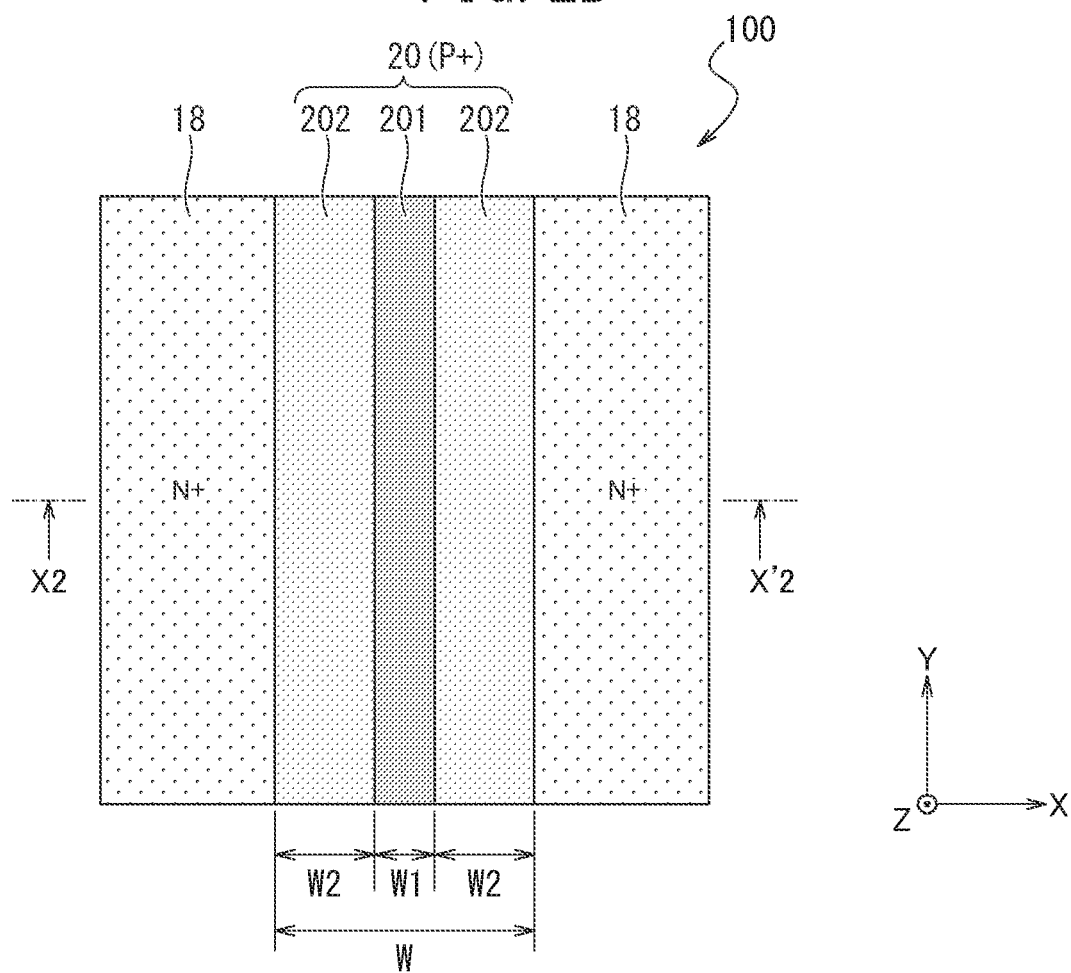

FIG. 4F
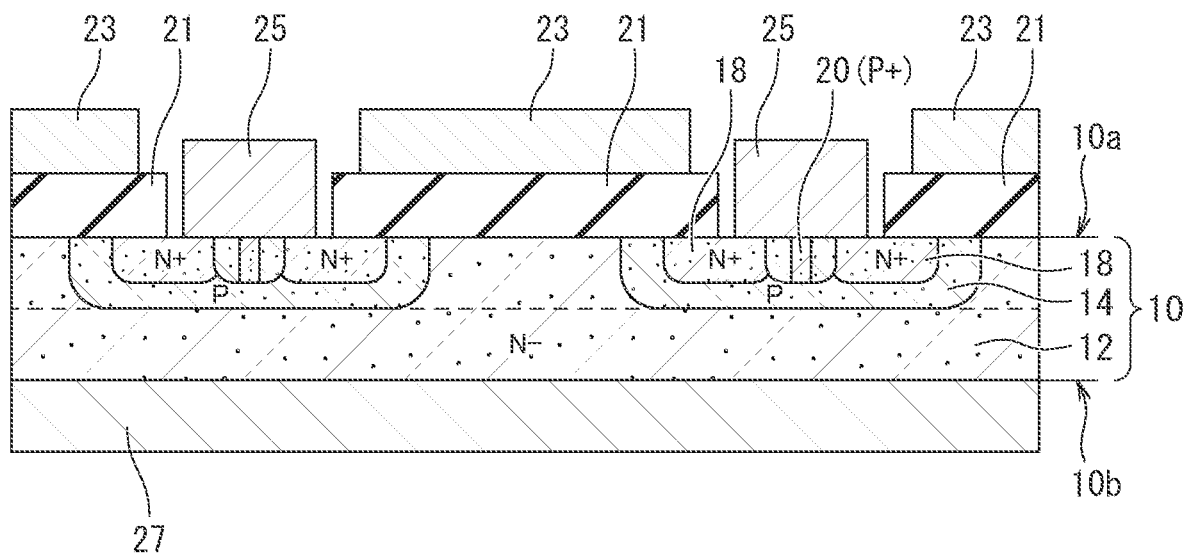
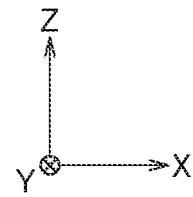

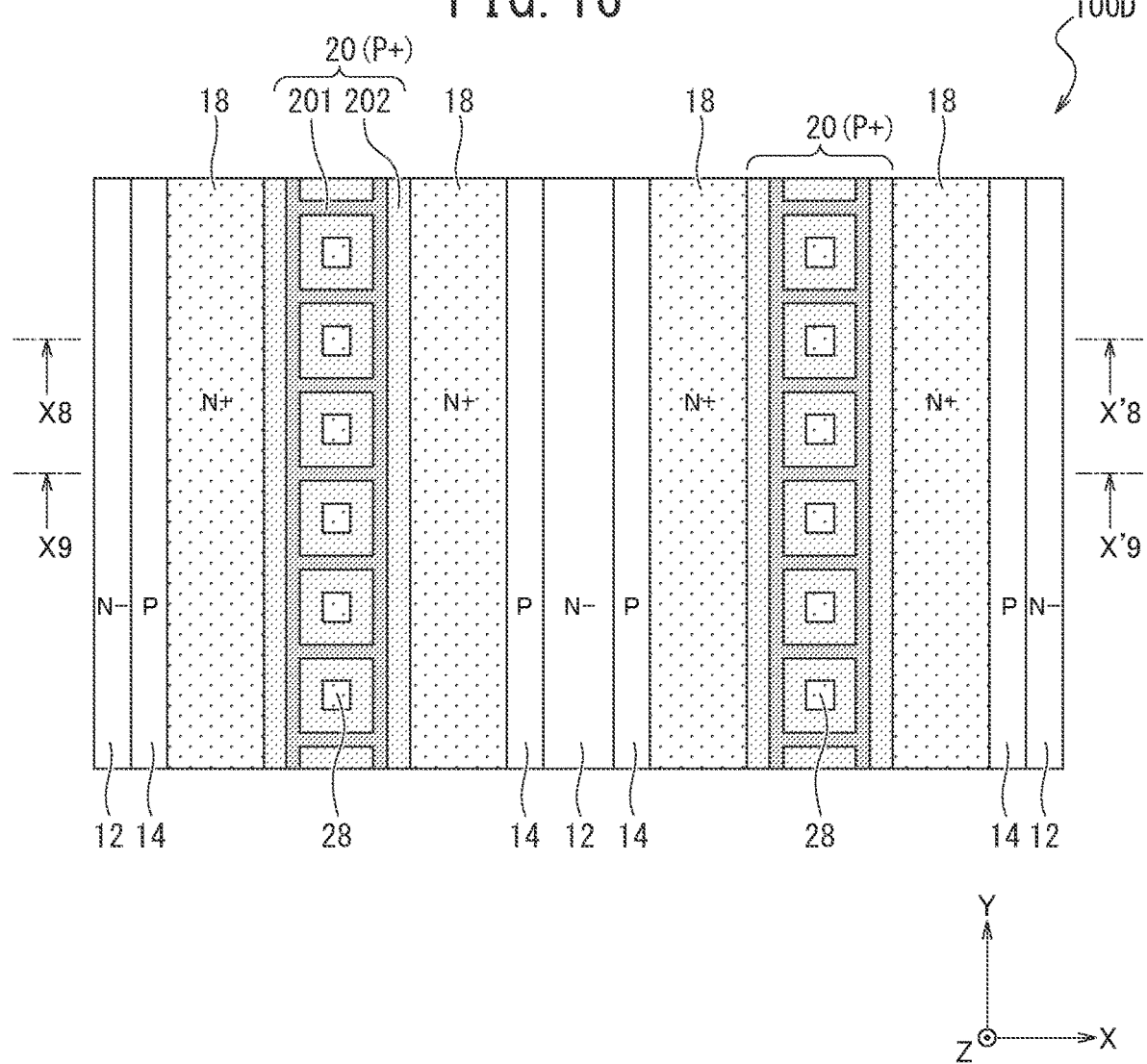

METHOD FOR MANUFACTURING NITRIDE SEMICONDUCTOR DEVICE AND NITRIDE SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2021-36613 filed on Mar. 8, 2021, the entire contents of which are incorporated by reference herein.

TECHNICAL FIELD

The present invention relates to a method for manufacturing a nitride semiconductor device and a nitride semiconductor device.

BACKGROUND ART

Nitride semiconductor devices having a vertical metal oxide semiconductor (MOS) structure have been known (see, for example, PTL 1). In addition, in a nitride semiconductor device, it is possible to control a degree of conductivity of a P-type region by using magnesium (Mg) as a dopant (see, for example, PTL 2).

In order to achieve excellent ohmic contact in a nitride semiconductor device, it is necessary to selectively form a highly concentrated P-type region in the nitride semiconductor device. As a method for selectively forming a P-type region, it is preferable to use ion implantation from a viewpoint of cost, productivity and reliability. However, when ions of Mg are implanted into a nitride semiconductor at a high concentration and the nitride semiconductor is subjected to heat treatment at a high temperature exceeding 1300° C. in order to activate Mg, Mg segregates at high density in a rod-like manner. When Mg segregates at high density in a rod-like manner, Mg concentration decreases in a region other than a region in which segregation occurs (see, for example, NPL 1). In addition, when heat treatment is performed at high temperature further exceeding 1400° C. in a very high pressure atmosphere, Mg diffuses deeply and Mg concentration decreases (see, for example, NPL 2). For this reason, it has been difficult to form a highly concentrated P-type region.

CITATION LIST

Patent Literature

PTL 1: JP 2019-096744 A
PTL 2: JP 2014-086698 A

Non Patent Literature

NPL 1: Kumar et.al., J. Appl. Phys. 126 (2019) 235704.
NPL 2: H. Sakurai et.al., Appl. Phys. Lett. 115, 142104 (2019).
NPL 3: G. Miceli, A. Pasquarello PRB (2016).

SUMMARY OF INVENTION

Technical Problem

When Mg is activated by heat treatment and a P-type region is formed, the Fermi level of the P-type region comes close to the valence band. When the Fermi level comes close to the valence band, Mg acceptor formation energy (that is, energy required to incorporate Mg into Ga sites of GaN) increases and activation of Mg is destabilized (see, for example, NPL 3). It is considered that the above-described segregation of Mg at high density occurs because activation of Mg becomes unstable and Mg becomes likely to segregate via defects.

The present invention has been made through earnest examination by the inventors based on the above-described consideration, and an object of the present invention is to provide a method for manufacturing a nitride semiconductor device capable of forming a highly concentrated P-type region and a nitride semiconductor device.

Solution to Problem

In order to achieve the above-described object, according to an aspect of the present invention, there is provided a method for manufacturing a nitride semiconductor device including: a step of forming N-type regions in a nitride semiconductor layer; a step of implanting ions of an acceptor element into a region sandwiched by the N-type regions on both sides in the nitride semiconductor layer; and a step of forming a P-type region sandwiched by the N-type regions on both sides by subjecting the nitride semiconductor layer in which the N-type regions are formed and into which ions of the acceptor element are implanted to heat treatment and activating the acceptor element, wherein, in the step of forming the N-type regions, the method implants ions of a donor element to the nitride semiconductor layer at a high concentration in such a way that concentration of the donor element in the N-type regions has a value equal to or greater than concentration of the acceptor element in the P-type region, and in the step of implanting ions of the acceptor element, the method implants ions of the acceptor element in such a way that concentration of the acceptor element in the P-type region is $1 \times 10^{19}$ cm$^{-3}$ or more and $1 \times 10^{21}$ cm$^{-3}$ or less.

According to another aspect of the present invention, there is provided a nitride semiconductor device including: a nitride semiconductor layer; N-type regions formed on one surface side of the nitride semiconductor layer; and a P-type region formed on the one surface side of the nitride semiconductor layer and sandwiched by the N-type regions on both sides, wherein concentration of a donor element in the N-type regions has a value equal to or greater than concentration of an acceptor element in the P-type region, and concentration of the acceptor element in at least a portion of the P-type region is $1 \times 10^{19}$ cm$^{-3}$ or more and $1 \times 10^{21}$ cm$^{-3}$ or less.

Advantageous Effects of Invention

According to the present invention it is possible to provide a method for manufacturing a nitride semiconductor device capable of forming a highly concentrated P-type region and a nitride semiconductor device.

BRIEF DESCRIPTION OF DRAWINGS

FIG. 1 is a plan view illustrative of a configuration example of a GaN semiconductor device 100 according to a first embodiment of the present invention;

FIG. 2A is a plan view illustrative of a configuration example of a vertical MOSFET according to the first embodiment of the present invention in an enlarged manner;

FIG. 2B is a plan view illustrative of a region enclosed by a dashed line in the plan view in FIG. 2 in a further enlarged manner;

FIG. 4F is still another cross-sectional view illustrative of the manufacturing method for the GaN semiconductor device according to the first embodiment of the present invention in the sequence of steps;

FIG. 16 is a plan view illustrative of a configuration example of a GaN semiconductor device according to a fifth embodiment of the present invention;

DESCRIPTION OF EMBODIMENTS

Figure 3A:
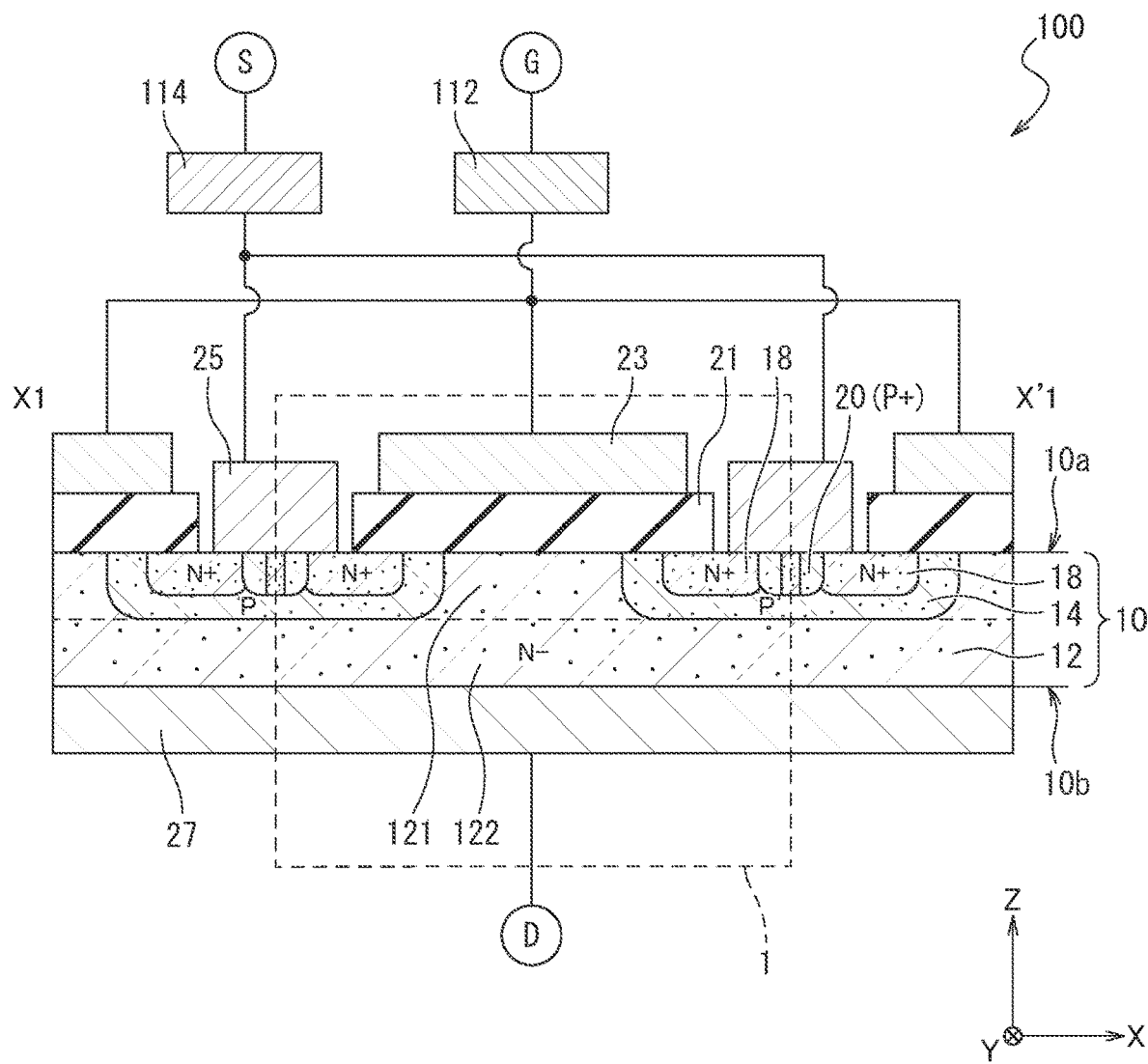
FIG. 3A is a cross-sectional view illustrative of the configuration example of the vertical MOSFET according to the first embodiment of the present invention.

Embodiments of the present invention will be described below. In the following description of the drawings, the same or similar portions are denoted by the same or similar reference numerals. However, it should be noted that the drawings are schematic and a relation between a thickness and a flat dimension, a ratio of thicknesses of respective devices or members, and the like are different from actual ones. Accordingly, specific thicknesses and dimensions should be determined with reference to the following description. In addition, it is certain that some portions have different dimensional relations and ratios between the drawings.

In addition, in the following description, descriptions relating to directions are sometimes made using wording such as "X-axis direction", "Y-axis direction", and "Z-axis direction". For example, the X-axis direction and the Y-axis direction are directions parallel to a front surface 10a of a GaN substrate 10, which will be described later. The X-axis direction and the Y-axis direction are also referred to as horizontal directions. In addition, the Z-axis direction is a direction perpendicularly intersecting the front surface 10a of the GaN substrate 10 (that is, the thickness direction of the GaN substrate 10). The X-axis direction, the Y-axis direction, and the Z-axis direction intersect one another at right angles.

In addition, in the following description, the term "as viewed in plan" means, for example, viewing from the direction perpendicularly intersecting the front surface 10a of the GaN substrate 10, which will be described later (for example, the Z-axis direction).

In the following description, the positive direction and the negative direction of the Z-axis are sometimes referred to as "upper" and "lower", respectively. The "upper" and the "lower" do not necessarily mean the vertical directions with respect to the ground surface. In other words, the directions to "upper" and "lower" are not limited to the directions of gravitational force. The "upper" and the "lower" are nothing more than expressions for the sake of convenience to specify relative positional relations in a region, a layer, a film, a substrate, or the like, and do not limit a technological concept of the present invention. For example, it is needless to say that, when the plane of paper is rotated 180 degrees, "upper" and "lower" are exchanged with "lower" and "upper", respectively.

In addition, in the following description, signs + and − attached to P or N, which indicate conductivity types, indicate that semiconductor regions to the conductivity types of which the signs + and − are attached are semiconductor regions the impurity concentrations of which are relatively higher and lower than another semiconductor region to the conductivity type of which neither + nor − is attached, respectively. However, two semiconductor regions having the same conductivity type P (or the same conductivity type N) assigned thereto does not necessarily mean that impurity concentrations of the semiconductor regions are exactly the same.

First Embodiment (Configuration Example)

FIG. 1 is a plan view illustrative of a configuration example of a gallium nitride semiconductor device (an example of a "nitride semiconductor device" of the present invention, and hereinafter, referred to as a GaN semiconductor device) 100 according to a first embodiment of the present invention. FIG. 1 is an X-Y plan view. As illustrated in FIG. 1, the GaN semiconductor device 100 includes an active region 110 and an edge termination region 130. The active region 110 includes a gate pad 112 and a source pad 114. The gate pad 112 and the source pad 114 are electrode pads that are electrically connected to gate electrodes 23 and source electrodes 25, which will be described later, respectively.

The edge termination region 130 surrounds the circumference of the active region 110 as viewed in plan from the Z-axis direction. The edge termination region 130 may have one or more of a guard ring structure and a junction termination extension (JTE) structure. The edge termination region 130 may have a function of, by extending depletion layers generated in the active region 110 to the edge termination region 130, preventing electric field concentration in the active region 110.

FIG. 2A is a plan view illustrative of a configuration example of a vertical MOSFET 1 according to the first embodiment of the present invention. In FIG. 2A, in order to illustrate a portion of the active region 110 illustrated in FIG. 1 in an enlarged manner and, at the same time, illustrate shapes of source regions 18 and the like as viewed in plan from the Z-axis direction, illustrations of the gate pad 112, the source pad 114, the gate electrodes 23, and the source electrodes 25 are omitted. FIG. 2B is a plan view illustrative of a region enclosed by a dashed line in the plan view in FIG. 2A in a further enlarged manner.

Figure 3B:
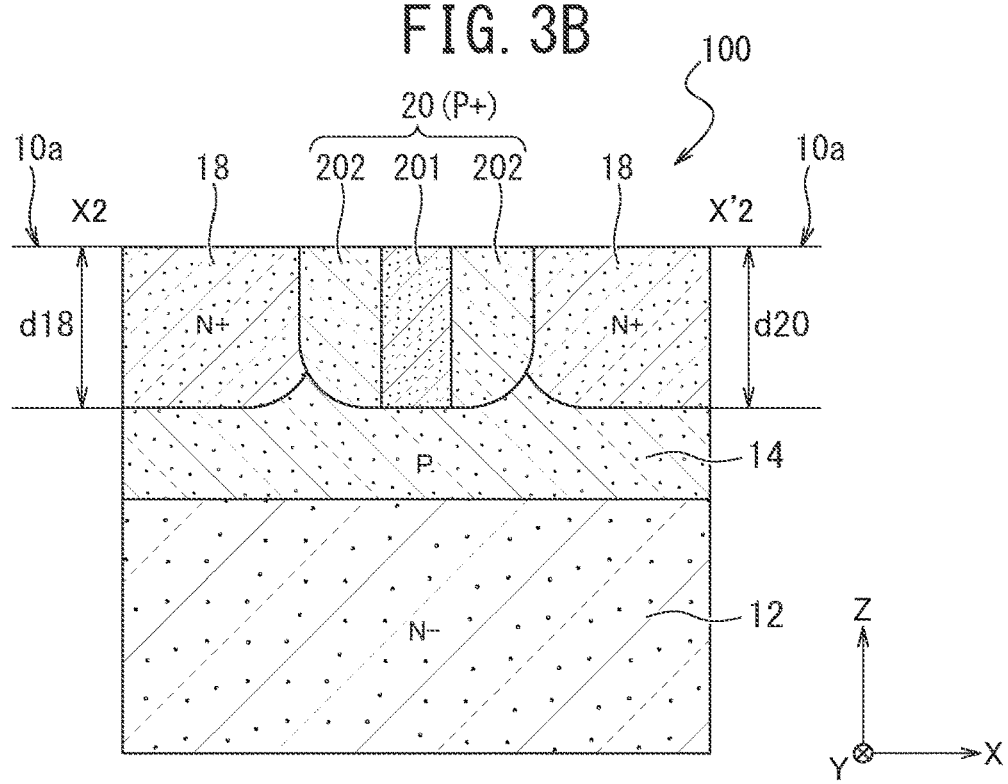
FIG. 3B is a cross-sectional view illustrative of a $P^+$-type region and a peripheral region thereof in the cross-sectional view in FIG. 3A in an enlarged manner.

FIG. 3A is a cross-sectional view illustrative of the configuration example of the vertical MOSFET 1 according to the first embodiment of the present invention. FIG. 3A illustrates a cross-section of the plan view in FIG. 2A taken along the line X1-X'1 thereof. FIG. 3B is a cross-sectional view illustrative of a P$^+$-type region 20 and a peripheral region thereof in the cross-sectional view in FIG. 3A, in an enlarged manner. FIG. 3B illustrates a cross-section of the plan view in FIG. 2B taken along the line X2-X'2 thereof.

The GaN semiconductor device 100 illustrated in FIGS. 2A and 3A includes a gallium nitride substrate (an example of a "nitride semiconductor layer" of the present invention, and hereinafter, referred to as a GaN substrate) 10 and a plurality of vertical MOSFETs 1 (an example of "field effect transistor" of the present invention) formed in the GaN substrate 10. In the GaN semiconductor device 100, the vertical MOSFETs 1 are repeatedly formed in one direction (for example, the X-axis direction). One vertical MOSFET 1 is a unit structure of the repeat, and the unit structures are arranged in line in one direction (for example, the X-axis direction).

As illustrated in FIGS. 2A and 3A, the vertical MOSFET 1 includes an N$^-$-type drift region 12, P-type well regions 14, N$^+$-type source regions 18 (an example of "N-type regions" of the present invention), and P$^+$-type regions 20 (an example of a "P-type region" of the present invention) that are formed in the GaN substrate 10, a gate insulating film 21 formed on the front surface 10$a$ (an example of "one surface" of the present invention) of the GaN substrate 10, a gate electrode 23 formed on the gate insulating film 21, source electrodes 25 (an example of an "electrode" of the present invention) that are formed on the front surface 10$a$ side of the GaN substrate 10 and that are electrically connected to the N$^+$-type source regions 18 and the P$^+$-type regions 20, and a drain electrode 27 that is formed on the back surface 10$b$ side of the GaN substrate 10 and that is electrically connected to the drift region 12.

The GaN substrate 10 is a GaN single crystal substrate. The GaN substrate 10 is, for example, an N$^-$-type substrate. The GaN substrate 10 has the front surface 10$a$ and the back surface 10$b$ that is located on the opposite side to the front surface 10$a$. For example, the GaN substrate 10 is a low dislocation free-standing GaN substrate the penetrating dislocation density of which is less than $1 \times 10^7$ cm$^{-2}$.

Donor elements (N-type impurities) contained in the GaN substrate 10 may be one or more types of elements from among silicon (Si), germanium (Ge), and oxygen (O).

In addition, acceptor elements (P-type impurities) contained in the GaN substrate 10 may be one or more types of elements from among magnesium (Mg), calcium (Ca), beryllium (Be), and zinc (Zn).

Even when a power device having a large area is formed in the GaN substrate 10, the GaN substrate 10 being a low dislocation free-standing GaN substrate enables leakage current in the power device to be reduced. This capability enables power devices to be manufactured with a high non-defective rate. It is also possible to prevent impurities that are ion-implanted from deeply diffusing along dislocations in heat treatment that is included in a manufacturing step of the vertical MOSFETs 1.

Note that the GaN substrate 10 may be of N-type instead of N$^-$-type. In addition, the GaN substrate 10 may include a GaN single crystal substrate and a single crystal GaN layer that is epitaxially grown on the GaN single crystal substrate. In this case, the GaN single crystal substrate may be of N$^+$-type or N-type, and the GaN layer may be of N-type or N$^-$-type. In addition, the GaN single crystal substrate may be a low dislocation free-standing GaN substrate.

In the vertical MOSFET 1, the GaN substrate 10 may include one or more elements of aluminum (Al) and indium (In). The GaN substrate 10 may be a mixed crystal semiconductor that contains a small amount of Al and In in GaN, that is, $Al_xIn_yGa_{1-x-y}N$ ($0 \leq x<1$, $0 \leq y<1$). Note that GaN is a semiconductor when x and y in $Al_xIn_yGa_{1-x-y}N$ are set as x=y=0.

In the GaN substrate 10, the drift region 12, the P-type well regions 14, the N+-type source regions 18, and the P+-type regions 20 are respectively formed. The well regions 14, the N+-type source regions 18, and the P+-type regions 20 are respectively regions where ions of impurities are implanted to a predetermined depth from the front surface 10a of the GaN substrate 10 and the impurities are activated by heat treatment.

For example, a P+-type region 20 is formed on the front surface side of each of the P-type well regions 14. The P+-type region 20 is in contact with the well region 14. The P+-type region 20 has a higher P-type impurity concentration than the well region 14. The well region 14 and the P+-type region 20 contain at least one of Mg and Be as an acceptor element.

To cite an example, the well region 14 and the P+-type region 20 contain Mg as an acceptor element. Mg concentration in the well region 14 is $1 \times 10^{16}$ cm$^{-3}$ or more and $3 \times 10^{18}$ cm$^{-3}$ or less. Mg concentration in at least a portion (for example, a second region 202, which will be described later) of the P+-type region 20 is $1 \times 10^{19}$ cm$^{-3}$ or more and $1 \times 10^{21}$ cm$^{-3}$ or less.

The drift region 12 is an N−-type region. The N-type source regions 18 have a higher N-type impurity concentration than the N−-type drift region 12. The drift region 12 and the N+-type regions 18 contain, for example, Si as N-type impurities. For example, the N-type impurity concentration of the drift region 12 is the same as the N-type impurity concentration of the GaN substrate 10. In this case, N-type impurities do not have to be ion-implanted into the drift region 12. Si concentration in the drift region 12 is $1 \times 10^{15}$ cm$^{-3}$ or more and $1 \times 10^{12}$ cm$^{-3}$ or less.

The N+-type source regions 18 are formed on the front surface side of the well regions 14. The N+-type source regions 18 are formed by ions of Si being implanted on the front surface side of the well regions 14 and Si being activated by heat treatment. Si concentration in the N+-type source regions 18 is $1 \times 10^{19}$ cm$^{-3}$ or more and $1 \times 10^{22}$ cm$^{-3}$ or less.

Upper portions of the N+-type source regions 18 are exposed on the front surface 10a of the GaN substrate 10. Each of the N+-type source regions 18 has one side portion in the X-axis direction and the other side portion that is located on the opposite side to the one side portion in the X-axis direction. The one side portion and bottom portion of each of the N+-type source regions 18 are in contact with one of the well regions 14, and the other side portion of the N+-type source region 18 is in contact with one of the P+-type regions 20. The one side portion of the N+-type source region 18 is located on the side on which a region in which a channel of the vertical MOSFET 1 is formed (hereinafter, referred to as a channel region) is located. Note that the channels of the vertical MOSFET 1 are formed in the well regions 14.

The P+-type regions 20 are exposed on the front surface 10a of the GaN substrate 10. Each of the P+-type regions 20 has both side portions in the X-axis direction in contact with N+-type source regions 18 and the bottom portion in contact with a well region 14. The well regions 14, the P+-type regions 20, and the N+-type source regions 18 have, for example, stripe shapes extending in the Y-axis direction.

Upper portions (hereinafter, referred to as upper regions) 121 of the drift region 12 are exposed on the front surface 10a of the GaN substrate 10. Each of the upper regions 121 is in contact with one of the gate insulating films 21 at the front surface 10a. Each of the upper regions 121 is located between a pair of well regions 14 that are opposed to each other in the X-axis direction. The upper regions 121 may be referred to as JFET regions. The upper regions 121 may be of N-type instead of N−-type. This configuration enables on-resistance of the vertical MOSFETs 1 to be reduced.

A lower portion (hereinafter, referred to as a lower region) 122 of the drift region 12 is in contact with the bottom portions of the well regions 14. The lower region 122 is located respectively between the upper regions 121 and the drain electrode 27 and between the well regions 14 and the drain electrode 27. The lower region 122 is formed in a continuous manner in the X-axis direction across a plurality of vertical MOSFETs 1 (that is, a plurality of unit structures) that are repeated in the X-axis direction.

The drift region 12 functions as current paths between the drain electrode 27 and the channel regions. Each of the P+-type regions 20 is a region for establishing contact between one of the well regions 14 and an electrode (for example, a source electrode 25). The P+-type regions 20 also function as hole extraction paths at the time of gate-off.

The gate insulating films 21 are, for example, silicon oxide films ($SiO_2$ films). The gate insulating films 21 are, for example, formed on the flat front surface 10a.

Each of the gate electrodes 23 is formed over channel regions with a gate insulating film 21 interposed therebetween. For example, the gate electrodes 23 are planar gate electrodes formed on the flat gate insulating films 21. The gate electrodes 23 are formed of a material different from the material of which the gate pad 112 is made. The gate electrodes 23 are formed of impurity-doped polysilicon, and the gate pad 112 is formed of Al or an alloy of Al—Si.

The source electrodes 25 are formed on the front surface 10a of the GaN substrate 10. Each of the source electrode 25 is in contact with portions of N+-type source regions 18 and a P+-type region 20. The source electrodes 25 may also be formed over the gate electrodes 23 with not-illustrated interlayer insulating films interposed therebetween. The interlayer insulating films may cover upper portions and side portions of the gate electrodes 23 lest the gate electrodes 23 and the source electrodes 25 electrically connect to each other.

The source electrodes 25 are formed of the same material as that of the source pad 114. For example, the source electrodes 25 formed of Al or an alloy of Al—Si also serve as the source pad 114. The source electrodes 25 may have barrier metal layers between the front surface 10a of the GaN layer 10 and Al (or Al—Si) of the source electrodes 25. Titanium (Ti) may be used as a material of the barrier metal layers. The drain electrode 27 is formed on the back surface 10b side of the GaN substrate 10 and is in contact with the back surface 10b. The drain electrode 27 is also formed of the same material as that of the source electrodes 25.

In FIG. 3A, a gate terminal, a source terminal, and a drain terminal are denoted by G, D, and S, respectively. For example, when a potential equal to or greater than a threshold voltage is provided to the gate electrodes 23 via the gate terminal G, inversion layers are formed in the channel regions. When a predetermined high potential is provided to the drain electrode 27 and a low potential (for example, ground potential) is provided to the source electrodes 25 while inversion layers are formed in the channel regions, current flows from the drain terminal D to the source terminal S. In addition, when a potential lower than the threshold voltage is provided to the gate electrodes 23, no inversion layer is formed in the channel regions and current is cut off. This configuration enables the vertical MOSFETs 1 to switch current between the source terminal S and the drain terminal D.

As illustrated in FIGS. 2B and 3B, each of the P$^+$-type regions 20 includes a first region 201 and second regions 202 located on both sides in the X-axis direction of the first region 201. Each of the second regions 202 is located between the first region 201 and an N$^+$-type source regions 18 and is respectively in contact with the first region 201 and the N$^+$-type source region 18. Among the constituent regions of the P$^+$-type region 20, the second regions 202 are in contact with the N$^+$-type source regions 18. When length in the X-axis direction (that is, width) of the P$^+$-type region 20, width of the first region 201, and width of each of the second regions 202 are denoted by W, W1, and W2, respectively, a relationship W=W1+W2×2 holds. W is, for example, 50 nm or more and 500 nm or less. W1 is 0 nm or more and 498 nm or less. W2 is, for example, 1 nm or more and 25 nm or less.

Since each of the P$^+$-type regions 20 is sandwiched by N$^+$-type source regions 18 on both sides, the width W of the P$^+$-type region 20 may be rephrased by an interval between the N$^+$-type source regions 18. That is, the above-described width W may be rephrased by an interval between portions of the N$^+$-type source regions 18, the portions sandwiching the P$^+$-type region 20 on both sides.

In each the P$^+$-type regions 20, density of Mg segregation in the second regions 202 is lower than density of Mg segregation in the first region 201. For example, Mg segregation is categorized into rod-like Mg segregation and non-rod-like Mg segregation. The rod-like Mg segregation is segregation having a length in one direction of 30 nm or more and segregation with a Mg concentration of $5 \times 10^{20}$ cm$^{-3}$ or more. The non-rod-like Mg segregation is segregation having a length in one direction of less than 30 nm and segregation with a Mg concentration of $5 \times 10^{20}$ cm$^{-3}$ or more. Density of rod-like acceptor segregation in the second regions 202 is $1 \times 10^{14}$ cm$^{-3}$ or less, and density of non-rod-like acceptor segregation in the second regions 202 is less than $1 \times 10^{15}$ cm$^{-3}$. Density of rod-like acceptor segregation and density of non-rod-like acceptor segregation in the first region 201 are higher than the respective densities in the second regions 202.

These features are achieved by forming N$^+$-type source regions 18 in adjacency to P$^+$-type formation regions 20' (see FIG. 4D) in advance when Mg that has been ion-implanted into the P$^+$-type formation regions 20' is activated by heat treatment, as described later. Forming N$^+$-type source regions 18 in contact with a P$^+$-type formation region 20' causes depletion layers to be formed in side portions (regions equivalent to the second regions 202) of the P$^+$-type formation region 20' and the Fermi level in the depletion layers to be prevented from coming close to the valence band (more preferably, causes the Fermi level to be brought close to the conduction band). This configuration causes Mg segregation in the second regions 202 to be suppressed.

Segregation of Mg being suppressed causes formation of a P$^+$-type region having high concentration and small variation in concentration to be achieved. In each of the P$^+$-type regions 20, depletion layers extending from the N$^+$-type source regions 18 causes segregation of Mg in the second regions 202 to be more suppressed than in the first region 201 and Mg concentration in the second regions 202 to be higher than that in the first region 201. For example, Mg concentration in the second regions 202 is $1 \times 10^{19}$ cm$^{-3}$ or more and $1 \times 10^{21}$ cm$^{-3}$ or less. Mg concentration in the first region 201 is lower than the Mg concentration in the second regions 202 and is reduced to around $3 \times 10^{13}$ cm$^{-3}$.

In addition, concentration of a donor element (for example, Si) in the N$^+$-type source regions 18 has a higher value than the Mg concentration in the second regions 202. These features cause the depletion layers to easily extend widely from the N$^+$-type source regions 18 to the second region 202 sides and the second regions 202 that have high Mg concentration to be easily formed widely.

Since the second regions 202 have high Mg concentration and small variation in the Mg concentration, it is possible to achieve excellent ohmic contact with respect to contact between the P$^+$-type region 20 and a source electrode 25.

Note that, as illustrated in FIG. 3B, depth d18 of each of the N$^+$-type source regions 18 from the front surface 10a and depth d20 of each of the P$^+$-type regions 20 from the front surface 10a are preferably the same depth as each other. For example, the depth d18 of the N$^+$-type source regions 18 and the depth d20 of the P$^+$-type regions 20 are respectively 1 nm or more and 500 nm or less and, for example, have a value in a range from several nm to several tens of nm. A difference between the depth d18 of the N$^+$-type source regions 18 and the depth d20 of the P$^+$-type regions 20 is preferably equal to or less than 50 nm (|d18−d20|≤50 nm). The reason for the restriction on the difference is that, when a P$^+$-type region 20 is shallower than N$^+$-type source regions 18, a lower portion of the P$^+$-type region 20 is depleted and connection resistance between the P$^+$-type region 20 and a P-type well region 14 is caused to increase. The reason is also that, since, when a P$^+$-type region 20 is deeper than N$^+$-type source regions 18, a portion of the P$^+$-type region 20 deeper than the N$^+$-type source regions 18 is located away from the N$^+$-type source regions 18, a depletion layer is unlikely to extend and Mg in the deeper portion becomes unlikely to be activated.

(Manufacturing Method)

Next, a method for manufacturing the GaN semiconductor device 100 according to the first embodiment of the present invention will be described. FIGS. 4A to 4F are cross-sectional views illustrative of the method for manufacturing the GaN semiconductor device 100 according to the first embodiment of the present invention in the sequence of steps. The GaN semiconductor device 100 is manufactured using various types of apparatuses, such as a film forming apparatus, an exposure apparatus, an etching apparatus, an ion implantation apparatus, and a heat treatment apparatus. Hereinafter, such apparatuses are collectively referred to as a manufacturing apparatus.

Figure 4A:
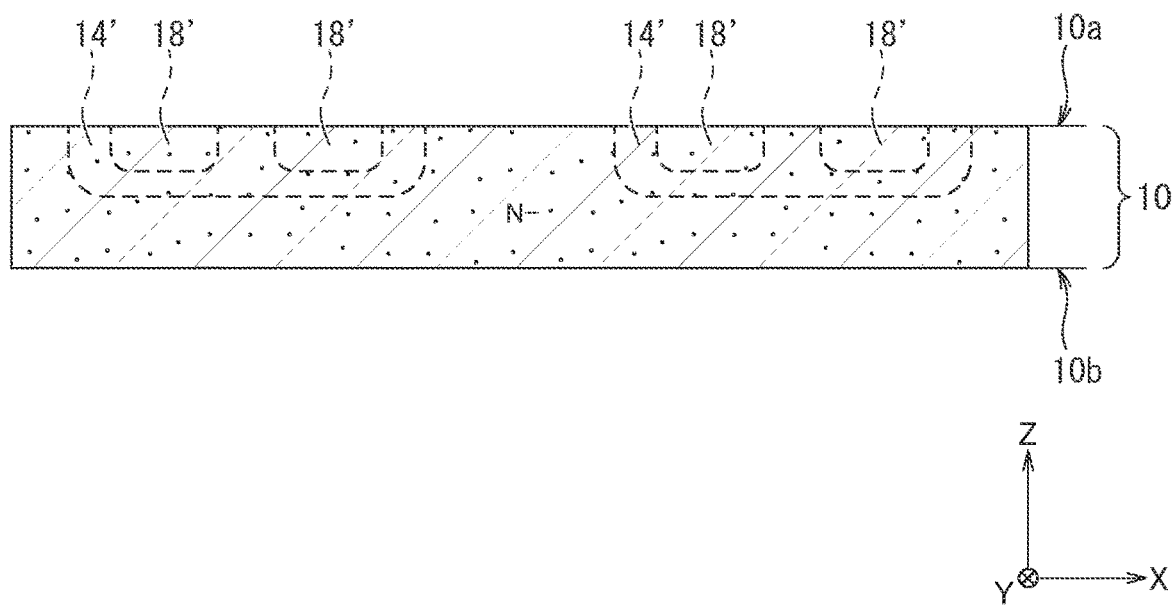
FIG. 4A is a cross-sectional view illustrative of a method for manufacturing the GaN semiconductor device according to the first embodiment of the present invention in the sequence of steps.

First, the manufacturing apparatus performs ion implantation for forming the well regions 14 (see FIG. 3A). For example, as illustrated in FIG. 4A, the manufacturing apparatus forms a mask (not illustrated) in which portions over regions (hereinafter, referred to as well formation regions) 14' in which the well regions 14 are to be formed are opened and that covers the upper parts of the other regions, on the GaN substrate 10 and implants, as an acceptor element, ions of Mg into the GaN substrate 10 on which the mask is formed. The mask is, for example, a resist pattern. After the ion implantation, the manufacturing apparatus removes the mask from the top of the GaN substrate 10.

In the ion implantation step for forming the well regions 14, Mg implantation energy (acceleration voltage) is set in such a way that the well regions 14 are formed to a deeper depth from the front surface 10a of the GaN substrate 10 than each of the N$^+$-type source regions 18 and the P$^+$-type regions 20 (see FIG. 3A). The ion implantation step may be performed by one-step ion implantation in which acceleration energy is applied in accordance with one condition or multi-step ion implantation in which acceleration energy is applied in accordance with a plurality of conditions. In addition, in the ion implantation step, a dose amount of Mg is set in such a way that Mg concentration in the well regions 14 is $1\times10^{16}$ cm$^{-3}$ or more and $3\times10^{18}$ cm$^{-3}$ or less.

Next, the manufacturing apparatus performs ion implantation for forming the N$^+$-type source regions 18 (see FIG. 3A). For example, the manufacturing apparatus forms a mask (not illustrated) in which portions over regions (hereinafter, referred to as source formation regions 18') in which the N$^+$-type source regions 18 are to be formed are opened and that covers the upper parts of the other regions, on the GaN substrate 10 and implants, as a donor element, ions of Si into the GaN substrate 10 on which the mask is formed. The mask is, for example, a resist pattern. After the ion implantation, the manufacturing apparatus removes the mask from the top of the GaN substrate 10.

In the ion implantation step for forming the N$^+$-type source regions 18, Si implantation energy (acceleration voltage) is set in such a way that the depth d18 of the N$^+$-type source regions 18 (see FIG. 3B) is 1 nm or more and 500 nm or less. In the ion implantation step, the Si implantation energy (acceleration voltage) is preferably set in such a way that the depth d18 of the N$^+$-type source regions 18 (see FIG. 3B) is the same depth as the depth d20 of the P$^+$-type regions 20.

In addition, in the ion implantation step for forming the N$^+$-type source regions 18, a dose amount of Si is set in such a way that Si concentration in the N$^+$-type source regions 18 has a value equal to or greater than Mg concentration in the P$^+$-type regions 20. For example, the dose amount of Si is set in such a way that Si concentration in the N$^+$-type source regions 18 is $1\times10^{19}$ cm$^{-3}$ or more and $1\times10^{22}$ cm$^{-3}$ or less.

Figure 4B:
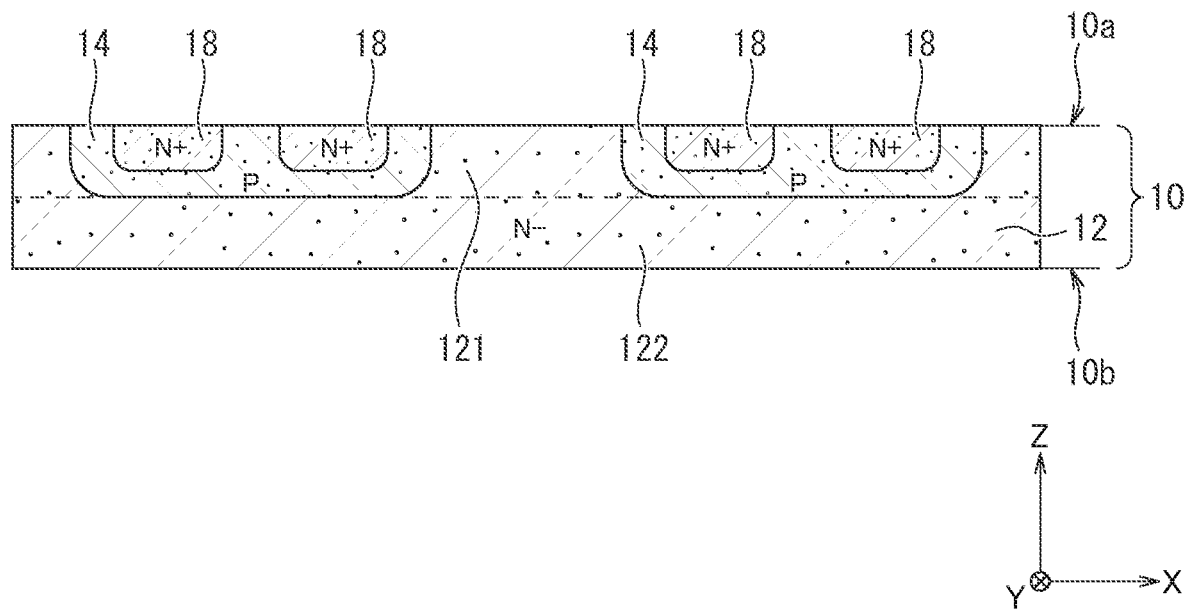
FIG. 4B is another cross-sectional view illustrative of the method for manufacturing the GaN semiconductor device according to the first embodiment of the present invention in the sequence of steps.

Next, the manufacturing apparatus subjects the GaN substrate 10 to heat treatment the maximum temperature of which is equal to or less than 1200° C. This heat treatment is, for example, rapid heat treatment. This heat treatment causes Mg and Si, which are ion-implanted into the GaN substrate 10, to be activated, and, as illustrated in FIG. 4B, the P-type well regions 14 and the N$^+$-type source regions 18 to be formed and, at the same time, the drift region 12 to be defined in the GaN substrate 10. In addition, this heat treatment enables defects induced by the ion implantation of Mg and Si to be repaired to some extent in the GaN substrate 10. Note that this heat treatment may be performed with a protective film formed on the GaN substrate 10. As the protective film, for example, aluminum nitride (AlN) or silicon nitride (SiN) may be used. The protective film is removed after the heat treatment.

Figure 4C:
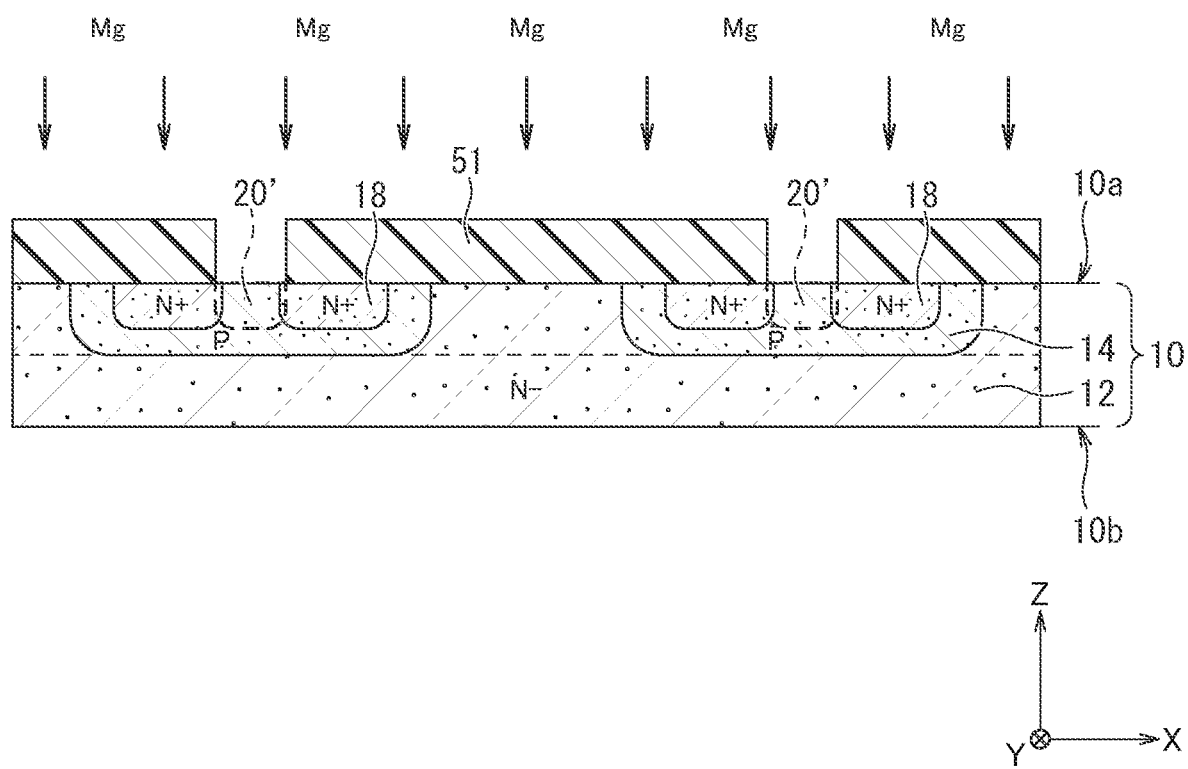
FIG. 4C is still another cross-sectional view illustrative of the method for manufacturing the GaN semiconductor device according to the first embodiment of the present invention in the sequence of steps.

Next, as illustrated in FIG. 4C, the manufacturing apparatus forms a mask 51 in which portions over regions (hereinafter, referred to as P$^+$-type formation regions) 20' in which the P$^+$-type regions 20 (see FIG. 3A) are to be formed are opened and that covers the upper parts of the other regions, on the GaN substrate 10. The mask 51 is, for example, a resist pattern. As illustrated in FIG. 4C, the P$^+$-type formation regions 20' may be set in such a way that portions of each of the P$^+$-type formation regions 20' overlap adjacent N$^+$-type source regions 18. Next, the manufacturing apparatus implants ions of Mg into the GaN substrate 10 on which the mask 51 is formed, as an acceptor element. After the ion implantation, the manufacturing apparatus removes the mask 51 from the top of the GaN substrate 10.

In the ion implantation step for forming the P$^+$-type regions 20, Mg implantation energy (acceleration voltage) is set in such a way that the depth d20 of the P$^+$-type regions 20 (see FIG. 3B) is 1 nm or more and 500 nm or less. In the ion implantation step, the Mg implantation energy (acceleration voltage) is preferably set in such a way that the depth d20 of the P$^+$-type regions 20 is the same depth as the depth d18 of the N$^+$-type source regions 18 (see FIG. 3B).

In addition, in the ion implantation step for forming the P$^+$-type regions 20, a dose amount of Mg is set in such a way that Mg concentration in the P$^+$-type regions 20 has a value equal to or less than Si concentration in the N$^+$-type source regions 18. For example, the dose amount of Mg is set in such a way that Mg concentration in the P$^+$-type regions 20 is $1\times10^{19}$ cm$^{-3}$ or more and $1\times10^{21}$ cm$^{-3}$ or less.

Figure 4D:
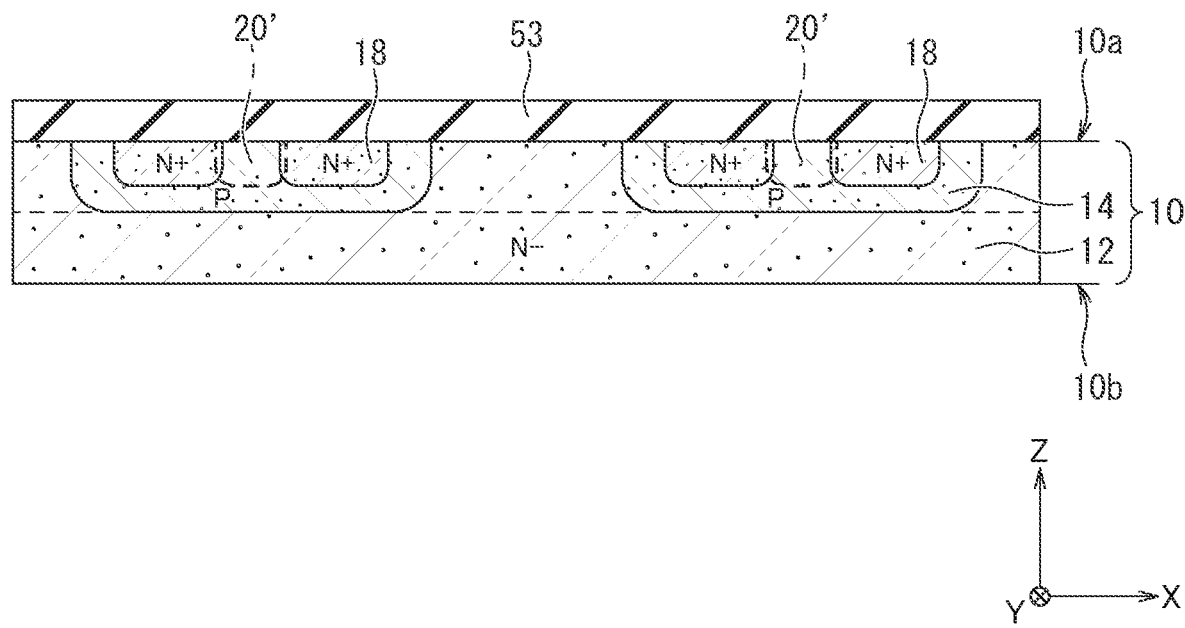
FIG. 4D is still another cross-sectional view illustrative of the manufacturing method for the GaN semiconductor device according to the first embodiment of the present invention in the sequence of steps.

Next, as illustrated in FIG. 4D, the manufacturing apparatus forms a protective film 53 on the GaN substrate 10. The protective film 53 is, for example, AlN or SiN.

Figure 4E:
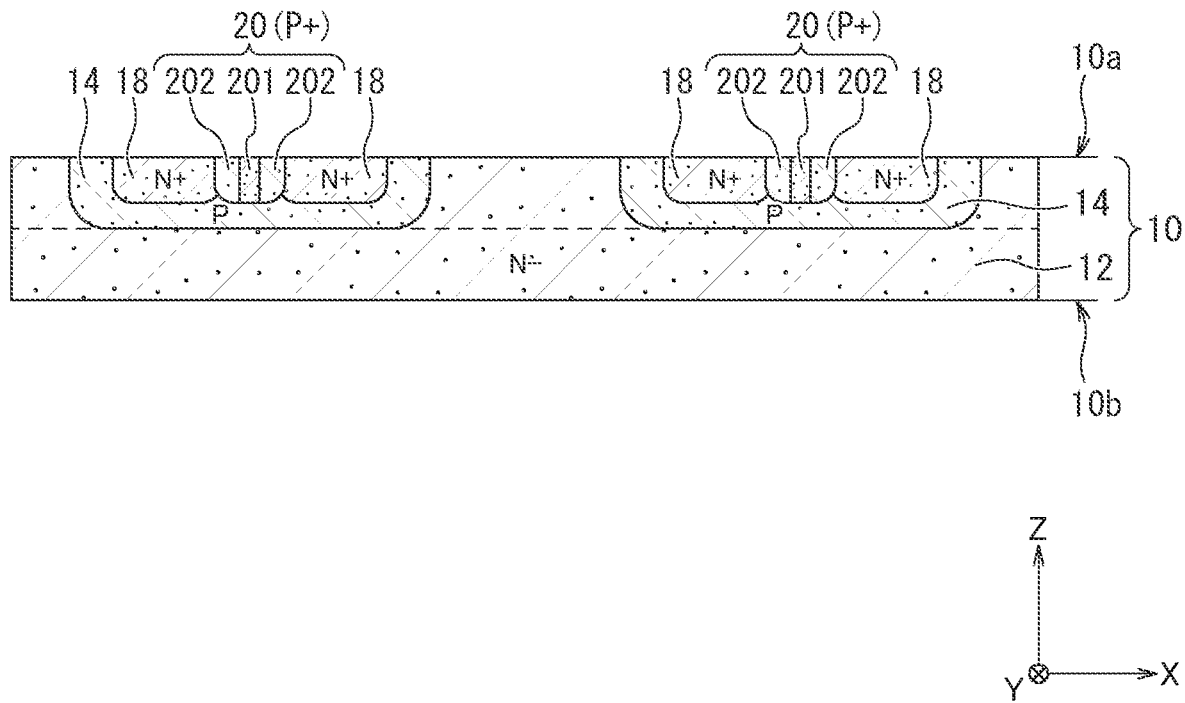
FIG. 4E is still another cross-sectional view illustrative of the manufacturing method for the GaN semiconductor device according to the first embodiment of the present invention in the sequence of steps.

Next, the manufacturing apparatus subjects the GaN substrate 10 covered by the protective film 53 to heat treatment the maximum temperature of which is 1300° C. or more and 2000° C. or less. This heat treatment is, for example, rapid heat treatment. This heat treatment causes Mg, which is ion-implanted into the GaN substrate 10, to be activated and, as illustrated in FIG. 4E, the P$^+$-type regions 20 to be formed in the GaN substrate 10. In addition, this heat treatment enables defects induced by the ion implantation of Mg to be repaired to some extent in the GaN substrate 10. After the heat treatment, the manufacturing apparatus removes the protective film 53 from the front surface 10a of the GaN substrate 10.

Next, as illustrated in FIG. 4F, the manufacturing apparatus forms the gate insulating films 21 on the GaN substrate 10. Next, the manufacturing apparatus forms the gate electrodes 23 and the source electrodes 25.

Next, the manufacturing apparatus forms an interlayer insulating film (not illustrated) on the front surface 10a of the GaN substrate 10 in such a way that the gate electrodes 23 and the source electrodes 25 are covered by the interlayer insulating film. Next, the manufacturing apparatus forms the gate pad 112 (see FIG. 1) that is electrically connected to the gate electrodes 23 and the source pad 114 (see FIG. 1) that is electrically connected to the source electrodes 25. Subsequently, the manufacturing apparatus forms the drain electrode 27 on the back surface 10b of the GaN substrate 10. Through the above-described steps, the GaN semiconductor device 100 including the vertical MOSFETs 1 (see FIG. 3A) is completed.

(Fermi-Level of Depletion Layer Generated in GaN)

Figure 5:
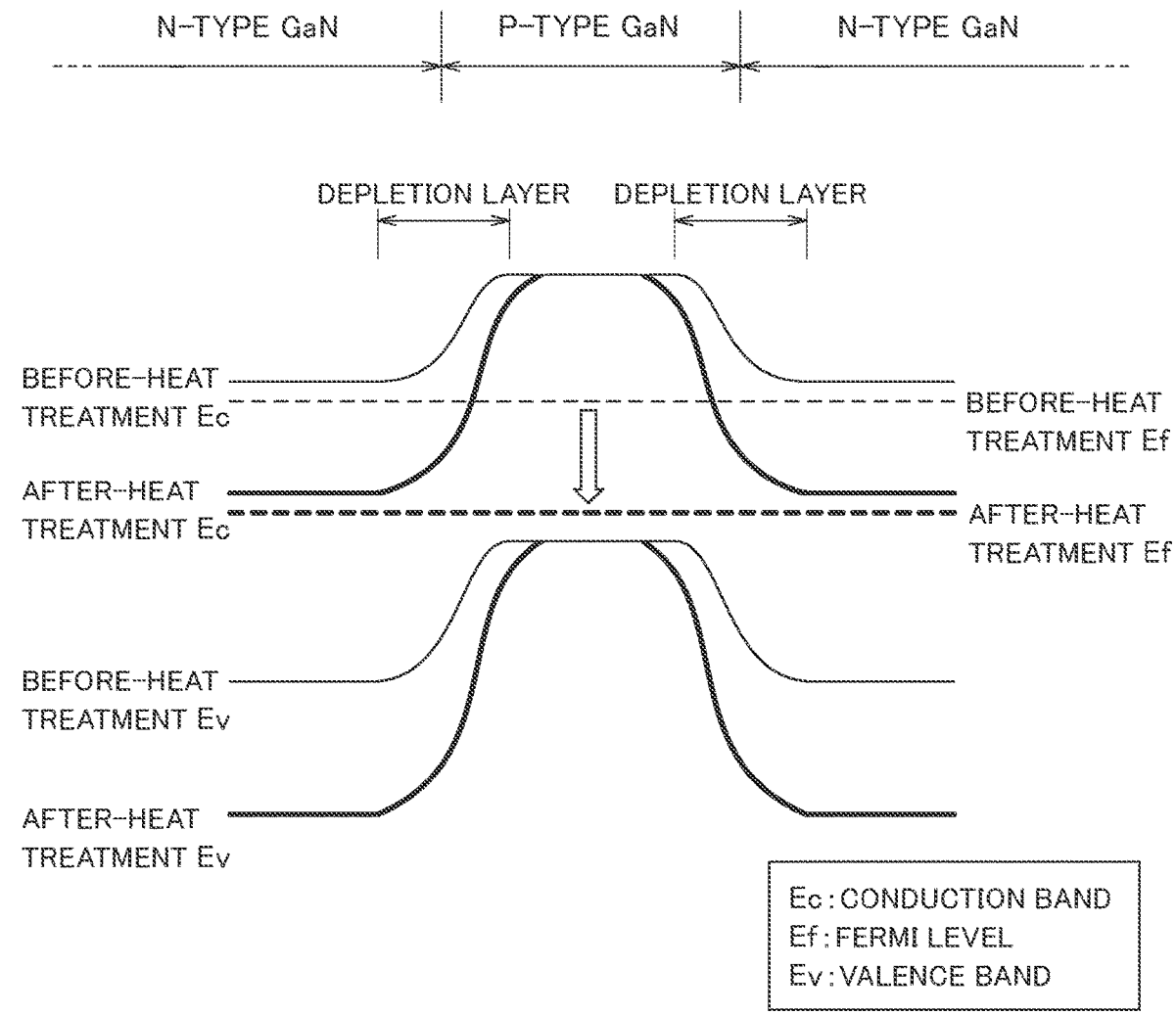
FIG. 5 is a band diagram of contact portions between N-type GaNs and a P-type GaN and a vicinity thereof and a diagram illustrative of valence bands Ev, conduction bands Ec, and Fermi levels Ef before and after heat treatment for activating an acceptor element (for example, Mg) that is ion-implanted into the P-type GaN.

FIG. 5 is a band diagram of contact portions between N-type GaNs and a P-type GaN and a vicinity thereof and a diagram illustrative of valence bands Ev, conduction bands Ec, and Fermi levels Ef before and after heat treatment for activating an acceptor element (for example, Mg) that is ion-implanted into the P-type GaN. Note that the N-type GaNs before and after heat treatment in FIG. 5 are equivalent to N$^+$-type source regions 18 of the present embodiment. In addition, the P-type GaN before heat treatment in FIG. 5 is equivalent to a P$^+$-type formation region 20' of the present embodiment and the P-type GaN after heat treatment is equivalent to a P$^+$-type region 20 of the present embodiment.

As illustrated in FIG. 5, depletion layers are generated in the contact portions between the N-type GaNs and the P-type GaN. A band structure bends in the depletion layers, and the Fermi level Ef of the N-type GaNs and the Fermi level Ef of the P-type GaN coincide with each other. When the N-type GaNs and the P-type GaN are subjected to heat treatment while the N-type GaNs and the P-type GaN are in this state, Mg is activated and the Fermi level comes close to the valence band in the P-type GaN, but the band structure bends in the depletion layers. For this reason, in the P-type GaN, the Fermi level Ef is prevented from coming close to the valence band in the regions in which depletion layers are generated as compared with the region in which no depletion layer is generated.

Figure 6:
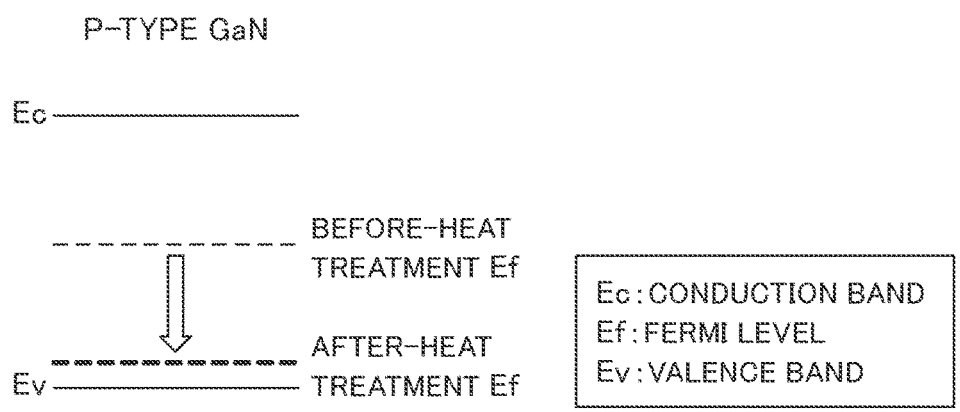
FIG. 6 is a band diagram of the P-type GaN in the case where no N-type GaN is present around the P-type GaN and a diagram illustrative of valence bands Ev, conduction bands Ec, and Fermi levels Ef before and after heat treatment for activating the acceptor element.

FIG. 6 is a band diagram of the P-type GaN in the case where no N-type GaN exists in the vicinity thereof and a diagram illustrative of valence bands Ev, conduction bands Ec, and Fermi levels Ef before and after heat treatment for activating the acceptor element. When no N-type GaN exists in the vicinity, no depletion layer is generated in the P-type GaN as illustrated in FIG. 6 and bending of the band structure in a depletion layer does not occur. When the P-type GaN covered by an insulating film is subjected to heat treatment, an acceptor element (for example, Mg) that is ion-implanted into the P-type GaN is activated and the Fermi level of the P-type GaN comes close to the valence band.

(Suppression of Mg Segregation by Control of Fermi Level)

Figure 7:
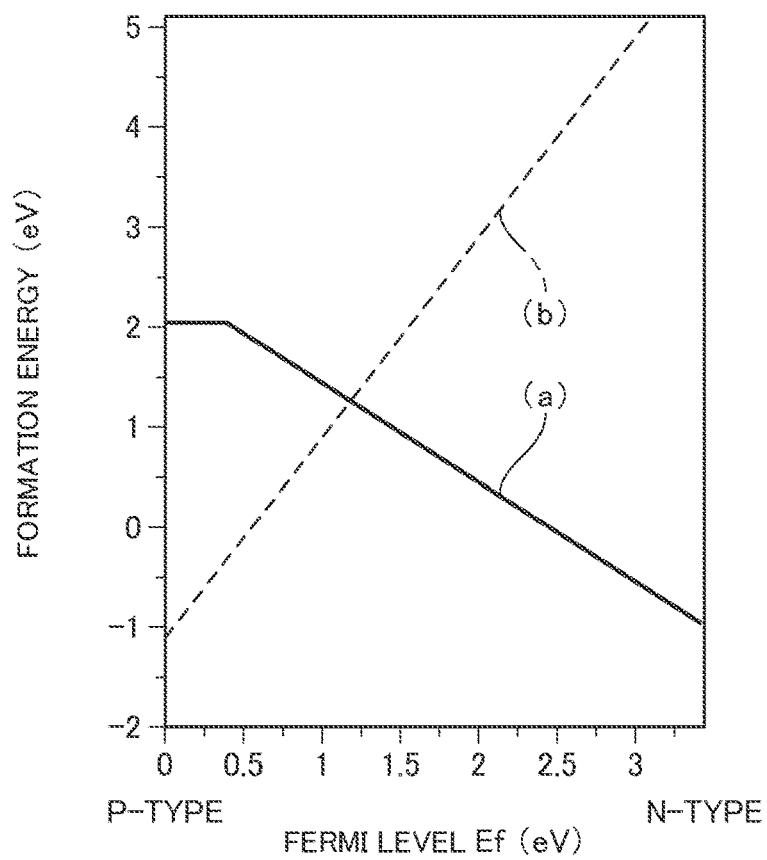
FIG. 7 is a graph illustrative of a relationship between Mg acceptor formation energy and the like in GaN and the Fermi level of GaN.

FIG. 7 is a graph illustrative of a relationship between Mg acceptor formation energy and the like in GaN and the Fermi level of GaN. This graph illustrates data calculated by first-principles calculations. The abscissa in FIG. 7 represents Fermi level Ef (eV), and the ordinate in FIG. 7 represents energy (eV). A solid line (a) in FIG. 7 indicates a relationship between Mg acceptor formation energy (that is, energy required to incorporate Mg into Ga sites of GaN) and the Fermi level Ef of GaN. A dashed line (b) in FIG. 7 indicates a relationship between energy required for Ga to enter into interstitial sites in GaN and the Fermi level Ef of GaN.

In FIG. 7, the closer to 0 (eV) the Fermi level Ef comes (that is, the closer to the valence band the Fermi level Ef comes and the closer to the P-type the conductivity type of GaN becomes), the larger the Mg acceptor formation energy becomes. In addition, the closer to 0 (eV) the Fermi level comes, the smaller energy required for Ga to enter into interstitial sites in GaN becomes.

From the graph in FIG. 7, it is revealed that the closer to the valence band the Fermi level of GaN comes and the closer to the P-type the conductivity type of GaN becomes, the harder Mg becomes to be activated and to function as acceptors. In other words, it is revealed that the closer to the conduction band the Fermi level of GaN comes and the closer to the N-type the conductivity type of GaN becomes, the easier Mg becomes to be activated and to function as acceptors.

In the embodiment of the present invention, both side portions of each of the P$^+$-type formation regions 20' have depletion layers formed by contact with N$^+$-type source regions 18, and the Fermi levels Ef of the depletion layers are prevented from coming close to the valence bands Ev. The Fermi levels Ef of both side portions of the P$^+$-type formation region 20' are controlled in such a way as not to come close to the valence bands. This configuration causes Mg to be easily activated and to easily function as acceptors in both side portions of the P$^+$-type formation region 20'.

(Width of Depletion Layer)

Figure 8:
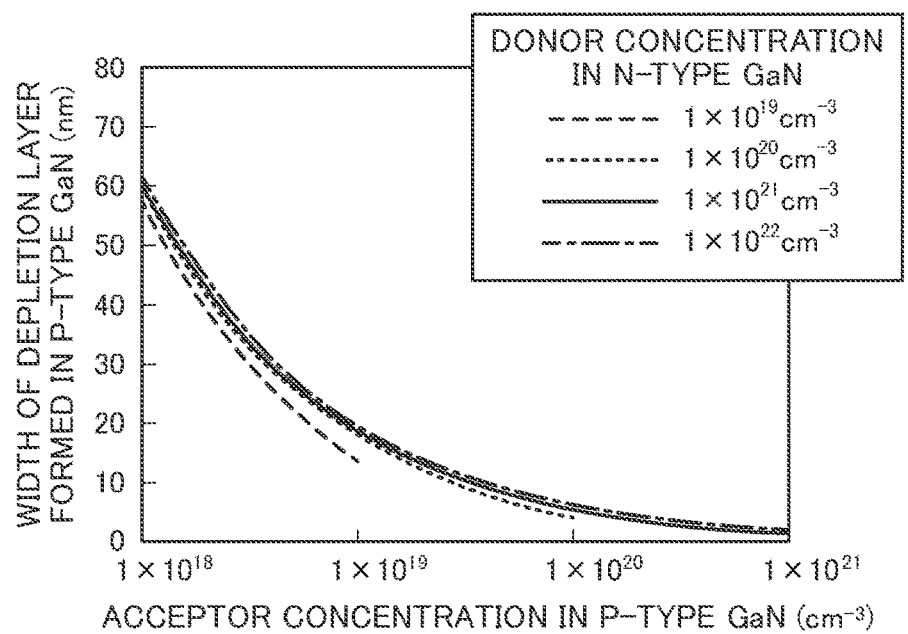
FIG. 8 is a graph illustrative of a relationship between acceptor concentration in a P-type GaN and width of a depletion layer formed in the P-type GaN by contact with an N-type GaN.

FIG. 8 is a graph illustrative of a relationship between acceptor concentration in a P-type GaN and width of a depletion layer formed in the P-type GaN by contact with an N-type GaN. The abscissa in FIG. 8 represents acceptor concentration (cm$^{-3}$) in the P-type GaN, and the ordinate in FIG. 8 represents width (nm) of a depletion layer formed in the P-type GaN.

As illustrated in FIG. 8, when acceptor concentration in the P-type GaN is $1\times10^{18}$ cm$^{-3}$ or more and $1\times10^{21}$ cm$^{-3}$ or less and donor concentration in the N-type GaN is $1\times10^{19}$ cm$^{-3}$ or more and $1\times10^{22}$ cm$^{-3}$ or less, width (depth) of a depletion layer formed in the P-type GaN by contact with the N-type GaN is approximately several nm or more and 60 nm or less. The higher the donor concentration in the N-type GaN becomes, the larger the width of a depletion layer formed in the P-type GaN tends to be. In addition, the higher the acceptor concentration in the P-type GaN becomes, the smaller the width of a depletion layer formed in the P-type GaN tends to be.

For example, when the acceptor concentration in the P-type GaN is $1\times10^{19}$ cm$^{-3}$ or more and $1\times10^{21}$ cm$^{-3}$ or less and the donor concentration in the N-type GaN is $1\times10^{19}$ cm$^{-3}$ or more and $1\times10^{22}$ cm$^{-3}$ or less, the width (depth) of a depletion layer formed in the P-type GaN by contact with the N-type GaN is 1 nm or more and 25 nm or less. When the acceptor concentration in the P-type GaN is in the order of $1\times10^{19}$ cm$^{-3}$, the width of a depletion layer formed in the P-type GaN by contact with the N-type GaN having a donor concentration of $1\times10^{19}$ cm$^{-3}$ or more and $1\times10^{22}$ cm$^{-3}$ or less is substantially approximately 25 nm.

As illustrated in FIG. 4D, each of the P$^+$-type formation regions 20' is sandwiched by N$^+$-type source regions 18 on both sides. Thus, when acceptor concentration (for example, Mg concentration) in the P$^+$-type formation region 20' is in the order of $1\times10^{19}$ cm$^{-3}$, depletion layers having a width of approximately 25 nm are respectively formed in both side portions of the P$^+$-type formation region 20'.

(Profiles of Mg and Si)

Figure 9:
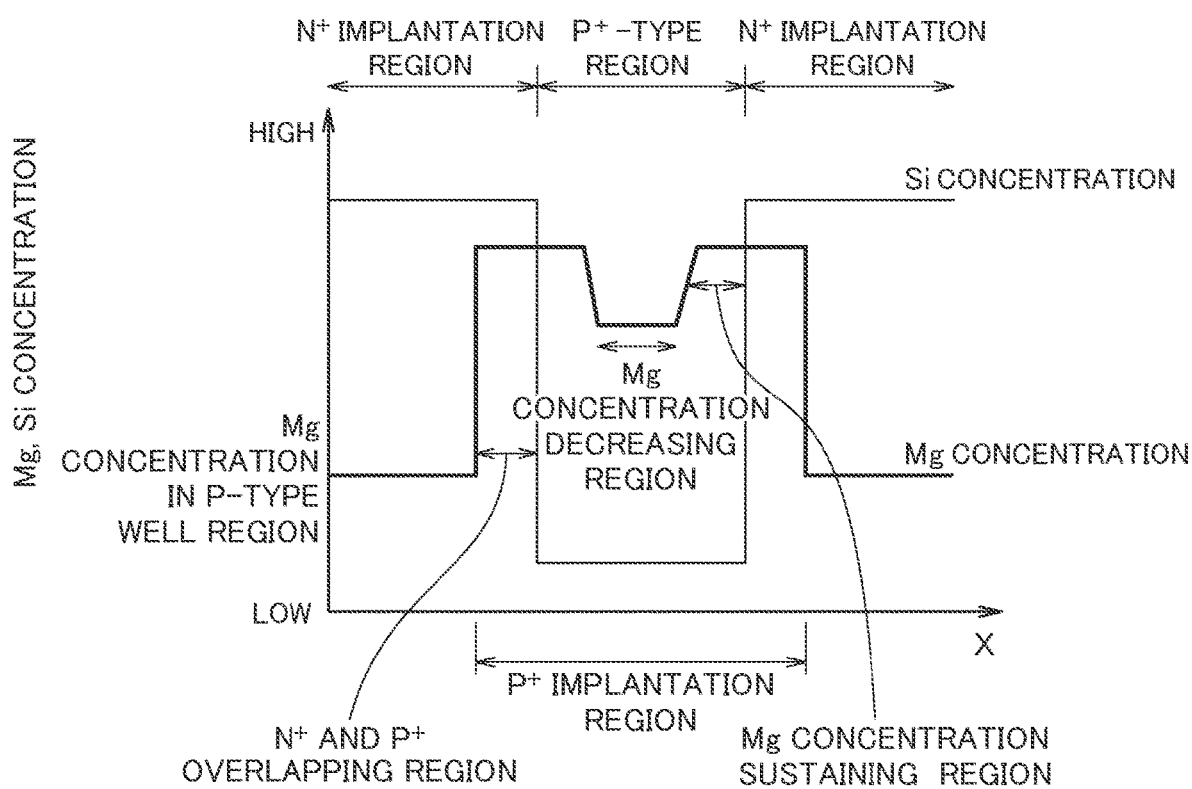
FIG. 9 is a graph illustrative of examples of concentration profiles of Mg and Si in GaN.

FIG. 9 is a graph illustrative of examples of concentration profiles of Mg and Si in the X-axis direction of GaN. The abscissa in FIG. 9 represents the X-axis direction, and the ordinate in FIG. 9 represents concentration of Mg or Si.

In FIG. 9, for example, N$^+$ implantation regions are equivalent to source formation regions 18' (see FIG. 4A), and a P$^+$ implantation region is equivalent to a P$^+$-type formation region 20' (see FIG. 4C). In addition, an N$^+$ and P$^+$ overlapping region is equivalent to an overlapping region between a source formation region 18' and a P$^+$-type formation region 20'. Since concentration of Si that is implanted into an N$^+$ implantation region is higher than concentration of Mg that is implanted into a P$^+$ implantation region, the conductivity type of an overlapping region between a source formation region 18' and a P$^+$-type formation region 20' is the N-type. In addition, in FIG. 9, for example, a Mg concentration decreasing region is equivalent to a first region 201 (see FIG. 3B), and a Mg concentration sustaining region is equivalent to a second region 202 (see FIG. 3B). Mg concentration sustaining regions are located on both sides of a Mg concentration decreasing region.

A Mg concentration sustaining region is depleted by contact with an activated N$^+$ implantation region (for example, an N$^+$-type source region 18) and is controlled in such a way that the Fermi level Ef does not come close to the valence band. Since this configuration enables activation of Mg to be stabilized and segregation of Mg to be suppressed in the Mg concentration sustaining region, the Mg concentration in the Mg concentration sustaining region is maintained high.

Width of a Mg concentration sustaining region is 1 nm or more and 25 nm or less as described above and is, for example, 25 nm. In addition, width of an interval between the N$^+$ implantation regions (that is, the P$^+$ region) is, for example, 50 nm or more and 500 nm or less, and preferably equal to or less than 100 nm. When the interval between the N+ implantation regions is narrowed, an area ratio of the Mg concentration sustaining region to the P+ region can be increased.

The Mg concentration decreasing region is not depleted because the Mg concentration decreasing region is located apart from the N+ implantation regions, and is a region in which the Fermi level Ef comes close to the valence band. In the Mg concentration decreasing region, the Mg concentration decreases because activation of Mg does not stabilize and Mg is likely to segregate as compared with the Mg concentration sustaining region. For example, in the Mg concentration decreasing region, the Mg concentration after activation decreases to around $3 \times 10^{18}$ cm$^{-3}$ because of deposition of Mg even when ions of Mg are implanted at the same concentration as the concentration in the Mg concentration sustaining region.

Advantageous Effects of First Embodiment

As described above, the method for manufacturing the GaN semiconductor device 100 according to the first embodiment of the present invention includes a step of forming the N+-type source regions 18 in the GaN substrate 10, a step of implanting ions of an acceptor element (for example, Mg) into regions each of which is sandwiched by N+-type source regions 18 on both sides in the GaN substrate 10, and a step of, by subjecting the GaN substrate 10 in which the N+-type source regions 18 are formed and into which ions of Mg are implanted to heat treatment and activating Mg, forming P+-type regions 20 each of which is sandwiched by N+-type source regions 18 on both sides. In the step of forming the N+-type source regions 18, in order to cause concentration of a donor element (for example, Si) in the N+-type source regions 18 to have a value equal to or greater than Mg concentration in the P+-type regions 20, ions of Si are implanted into the GaN substrate 10 at a high concentration. In the step of implanting ions of Mg, ions of Mg are implanted in such a way that the Mg concentration in the P+-type regions 20 is $1 \times 10^{19}$ cm$^{-3}$ or more and $1 \times 10^{21}$ cm$^{-3}$ or less.

According to this method, N+-type source regions 18 and a P+-type formation region 20' coming into contact with each other causes depletion layers to be generated in both side portions of the P+-type formation region 20', and the Fermi levels of the both side portions coincide with the Fermi level of the N+-type source regions 18. Since the N+-type source regions 18 are N+-type, it is possible to prevent the Fermi levels of depletion layers generated in both side portions of the P+-type formation region 20' from coming close to the valence band. Since, because of this capability, it is possible to maintain Mg acceptor formation energy low and facilitate Mg to be activated in both side portions of the P+-type formation region 20', it is possible to suppress segregation of Mg due to heat treatment and suppress decrease in Mg concentration due to Mg segregation.

In addition, Si concentration in the N+-type source regions 18 has a value equal to or greater than Mg concentration in the P+-type formation regions 20'. This configuration causes depletion layers to be widely formed in both side portions of a P+-type formation region 20' and second regions 202 in which decrease in Mg concentration due to Mg segregation is suppressed to be widely formed. This formation enables a highly concentrated P+-type region 20 to be achieved.

In addition, joining a source electrode 25 to such a P+-type region 20 enables a source contact with excellent ohmic characteristics to be achieved.

The GaN semiconductor device 100 according to the first embodiment of the present invention includes the GaN substrate 10, the N+-type source regions 18 formed on the front surface 10a side of the GaN substrate 10, and the P+-type regions 20 that are formed on the front surface 10a side of the GaN substrate 10 and each of which is sandwiched by N+-type source regions 18 on both sides. Si concentration in the N+-type source regions 18 has a value equal to or greater than Mg concentration in the P+-type regions 20. Mg concentration in at least a portion of each of the P+-type regions 20 is $1 \times 10^{19}$ cm$^{-3}$ or more and $1 \times 10^{21}$ cm$^{-3}$ or less. For example, Mg concentration in the second regions 202 of each of the P+-type regions 20 is $1 \times 10^{19}$ cm$^{-3}$ or more and $1 \times 10^{21}$ cm$^{-3}$ or less. The GaN semiconductor device 100 having such a configuration can be manufactured by the above-described manufacturing method.

Second Embodiment

In the above-described first embodiment, it was described that the P+-type regions 20 had stripe shapes extending in the Y-axis direction as viewed in plan. However, in the present invention, the shapes of P+-type regions 20 as viewed in plan are not limited to the above-described shapes. The P+-type regions 20 may have portions extending in the X-axis direction.

Figure 10:
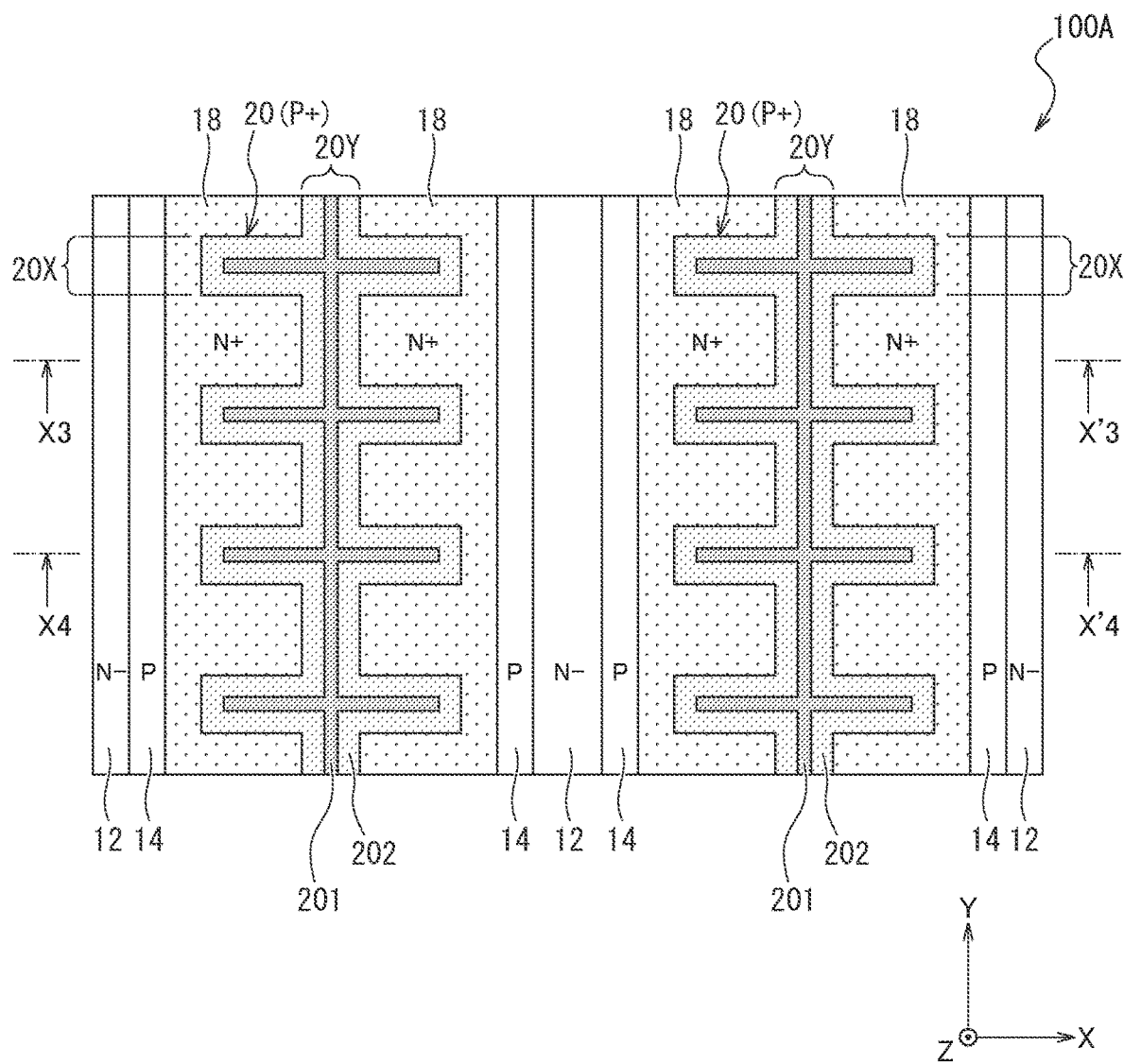
FIG. 10 is a plan view illustrative of a configuration example of a GaN semiconductor device according to a second embodiment of the present invention.
Figure 11A:
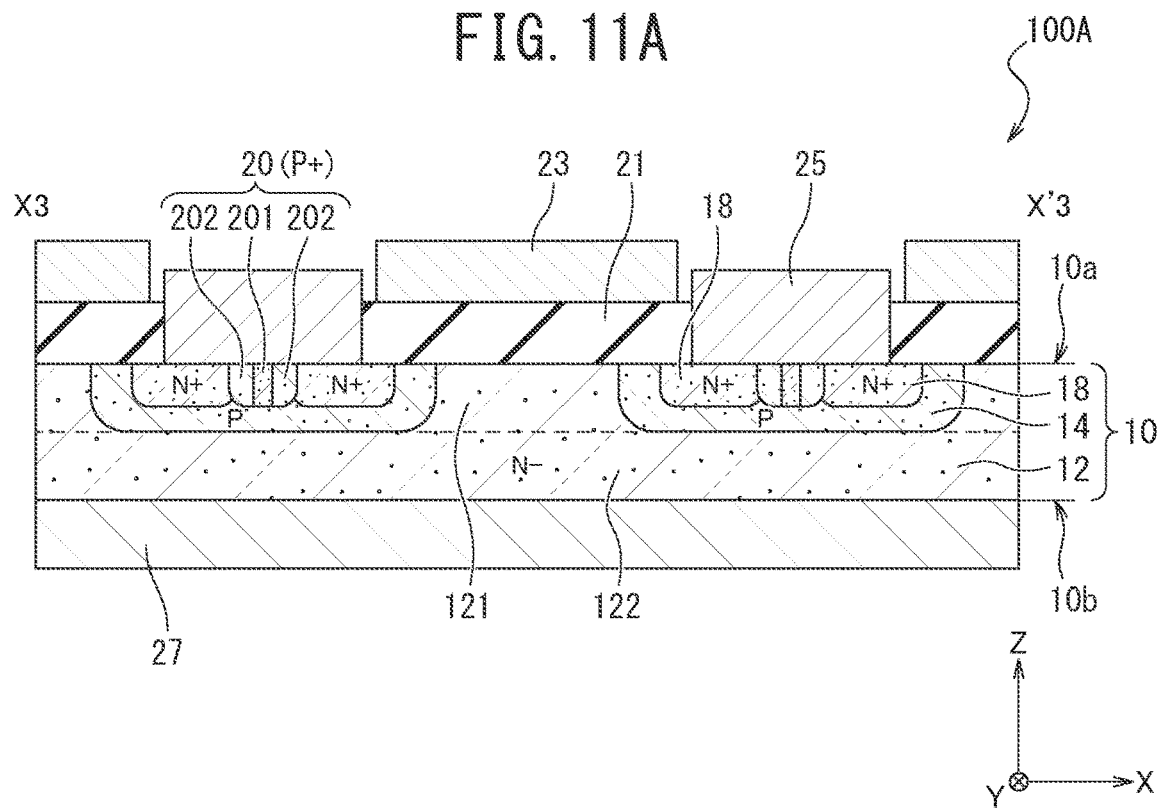
FIG. 11A is a cross-sectional view illustrative of the configuration example of the GaN semiconductor device according to the second embodiment of the present invention.
Figure 11B:
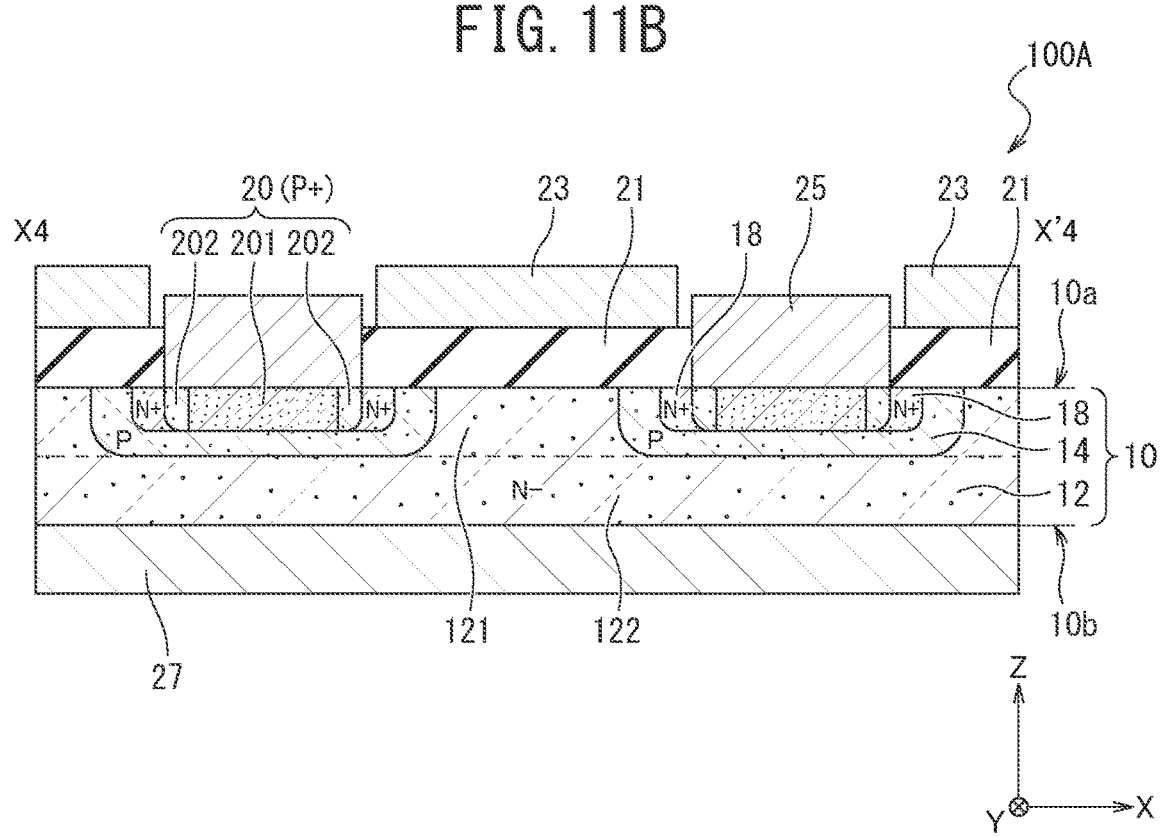
FIG. 11B is another cross-sectional view illustrative of the configuration example of the GaN semiconductor device according to the second embodiment of the present invention.

FIG. 10 is a plan view illustrative of a configuration example of a GaN semiconductor device 100A according to a second embodiment of the present invention. FIGS. 11A and 11B are cross-sectional views illustrative of the configuration example of the GaN semiconductor device 100A according to the second embodiment of the present invention. FIG. 11A illustrates a cross-section of the plan view in FIG. 10 taken along the line X3-X'3 thereof. FIG. 11B illustrates a cross-section of the plan view in FIG. 10 taken along the line X4-X'4 thereof.

As illustrated in FIGS. 10, 11A, and 11B, in the GaN semiconductor device 100A according to the second embodiment, each of the P+-type regions 20 has a first portion 20Y extending in the Y-axis direction and second portions 20X extending in the X-axis direction as viewed in plan, and the first portion 20Y and the second portions 20X are connected to each other and form a comb-teeth shape. As viewed in plan, the first portion 20Y and the second portions 20X are respectively sandwiched by N+-type source regions 18 on both sides and have a first region 201 and second regions 202 that are located on both sides of the first region 201.

In the GaN semiconductor device 100A according to the second embodiment, as with the GaN semiconductor device 100 according to the first embodiment, it is possible to achieve highly concentrated P+-type regions 20 in which segregation of Mg is suppressed in second regions 202 adjacent to N+-type source regions 18. In addition, in the GaN semiconductor device 100A, second regions 202 in which Mg segregation is suppressed and decrease in Mg concentration is suppressed are formed in not only the first portion 20Y but also the second portions 20X. This formation enables highly concentrated P+-type regions 20 of larger areas to be formed.

Third Embodiment

Figure 12:
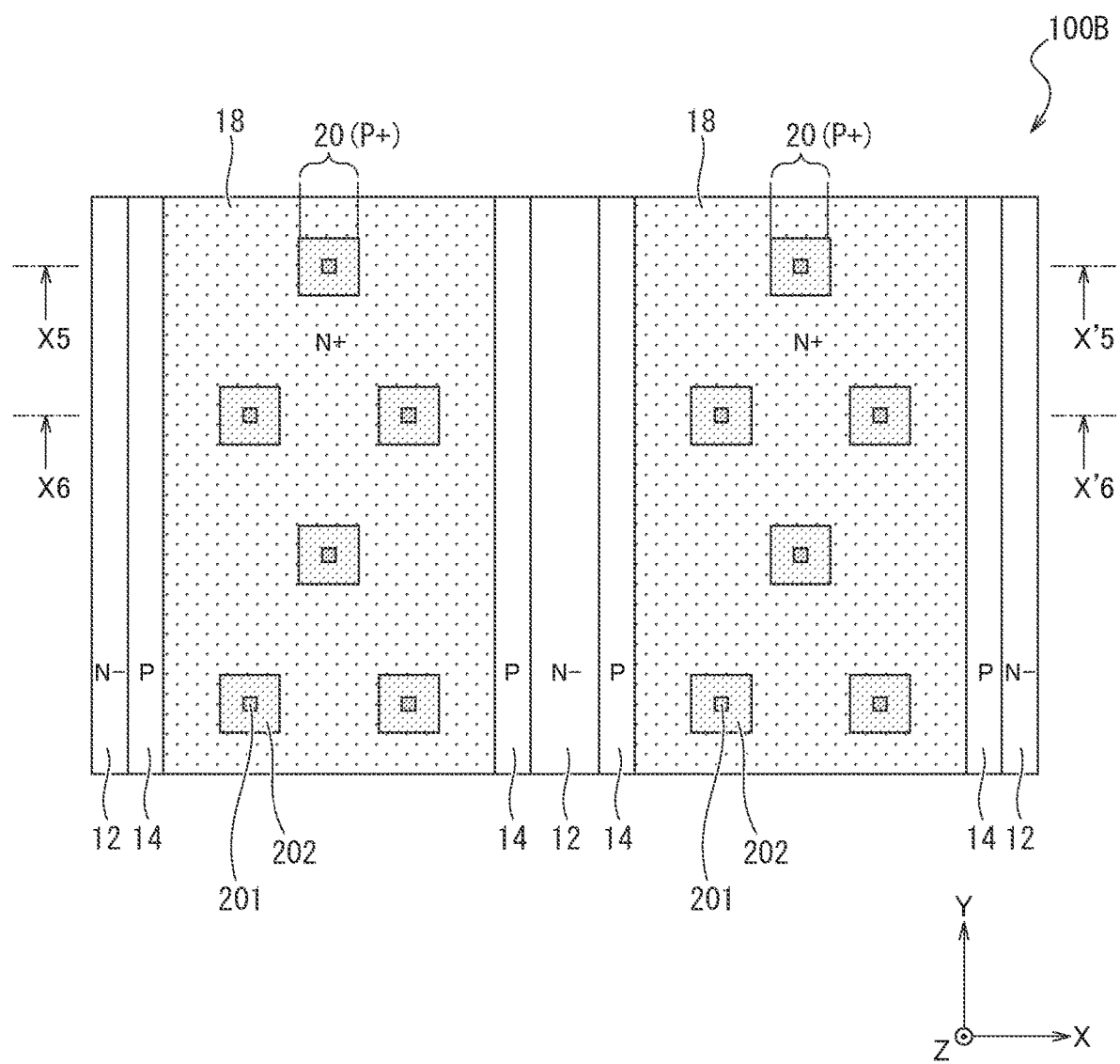
FIG. 12 is a plan view illustrative of a configuration example of a GaN semiconductor device according to a third embodiment of the present invention.
Figure 13A:
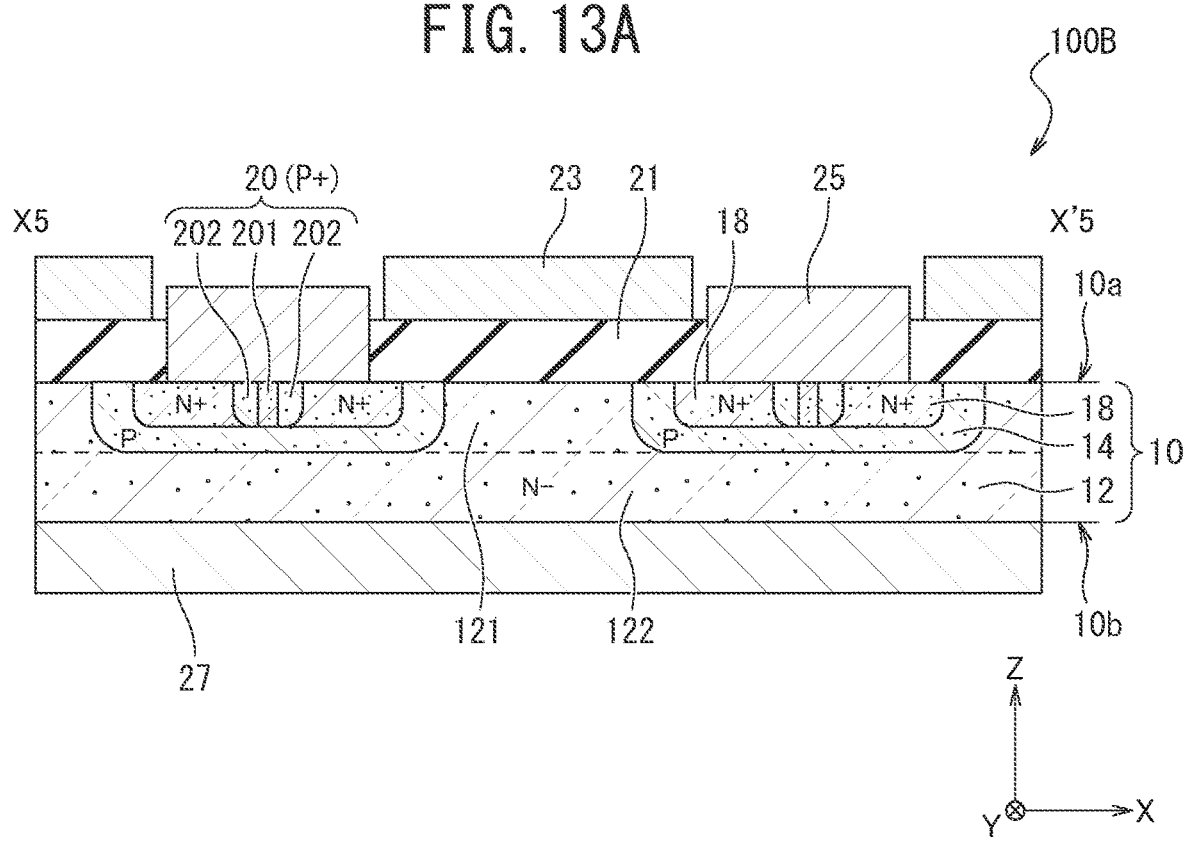
FIG. 13A is a cross-sectional view illustrative of the configuration example of the GaN semiconductor device according to the third embodiment of the present invention.
Figure 13B:
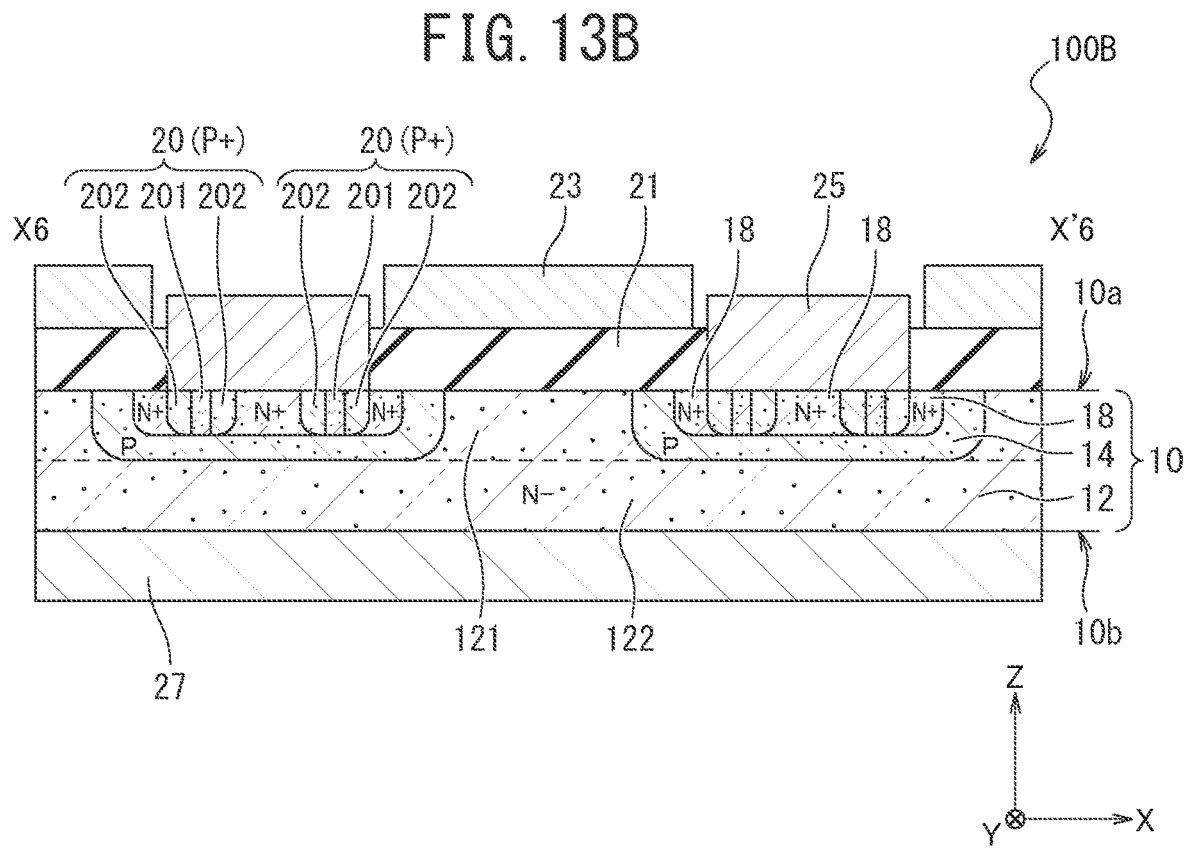
FIG. 13B is another cross-sectional view illustrative of the configuration example of the GaN semiconductor device according to the third embodiment of the present invention.

In an embodiment of the present invention, each P+-type region 20 may be arranged in a dot shape as viewed in plan. FIG. 12 is a plan view illustrative of a configuration example of a GaN semiconductor device 100B according to a third embodiment of the present invention. FIGS. 13A and 13B are cross-sectional views illustrative of the configuration example of the GaN semiconductor device 100B according to the third embodiment of the present invention. FIG. 13A illustrates a cross-section of the plan view in FIG. 12 taken along the line X5-X'5 thereof. FIG. 13B illustrates a cross-section of the plan view in FIG. 12 taken along the line X6-X'6 thereof.

As illustrated in FIGS. 12, 13A, and 13B, in the GaN semiconductor device 100B according to the third embodiment, each P$^+$-type region 20 is arranged in a dot shape as viewed in plan. Since each of the P$^+$-type regions 20 arranged in a dot shape is surrounded by an N$^+$-type source region 18 from all directions as viewed in plan, it is possible to increase a ratio of an activation area within one P$^+$-type region 20 (that is, a ratio of area of a second region 202).

In the GaN semiconductor device 100B according to the third embodiment, as with the GaN semiconductor device 100 according to the first embodiment, it is possible to achieve highly concentrated P$^+$-type regions 20 in each of which segregation of Mg is suppressed in a second region 202 adjacent to an N$^+$-type source region 18. In addition, in the GaN semiconductor device 100B, since it is possible to increase a ratio of an activation area within each P$^+$-type region 20 (that is, a ratio of area of a second region 202), it becomes possible to achieve more highly concentrated P$^+$-type regions 20.

Note that each of the dot-shaped P$^+$-type regions 20 is only required to be surrounded by an N$^+$-type source region 18 as viewed in plan and may be arranged at any position. In addition, although, in FIG. 12, a case where each of the dot-shaped P$^+$-type regions 20 is a square as viewed in plan is illustrated, the case is only an example. Each of the dot-shaped P$^+$-type regions 20 may be a rectangle or a circle as viewed in plan.

Fourth Embodiment

Figure 14:
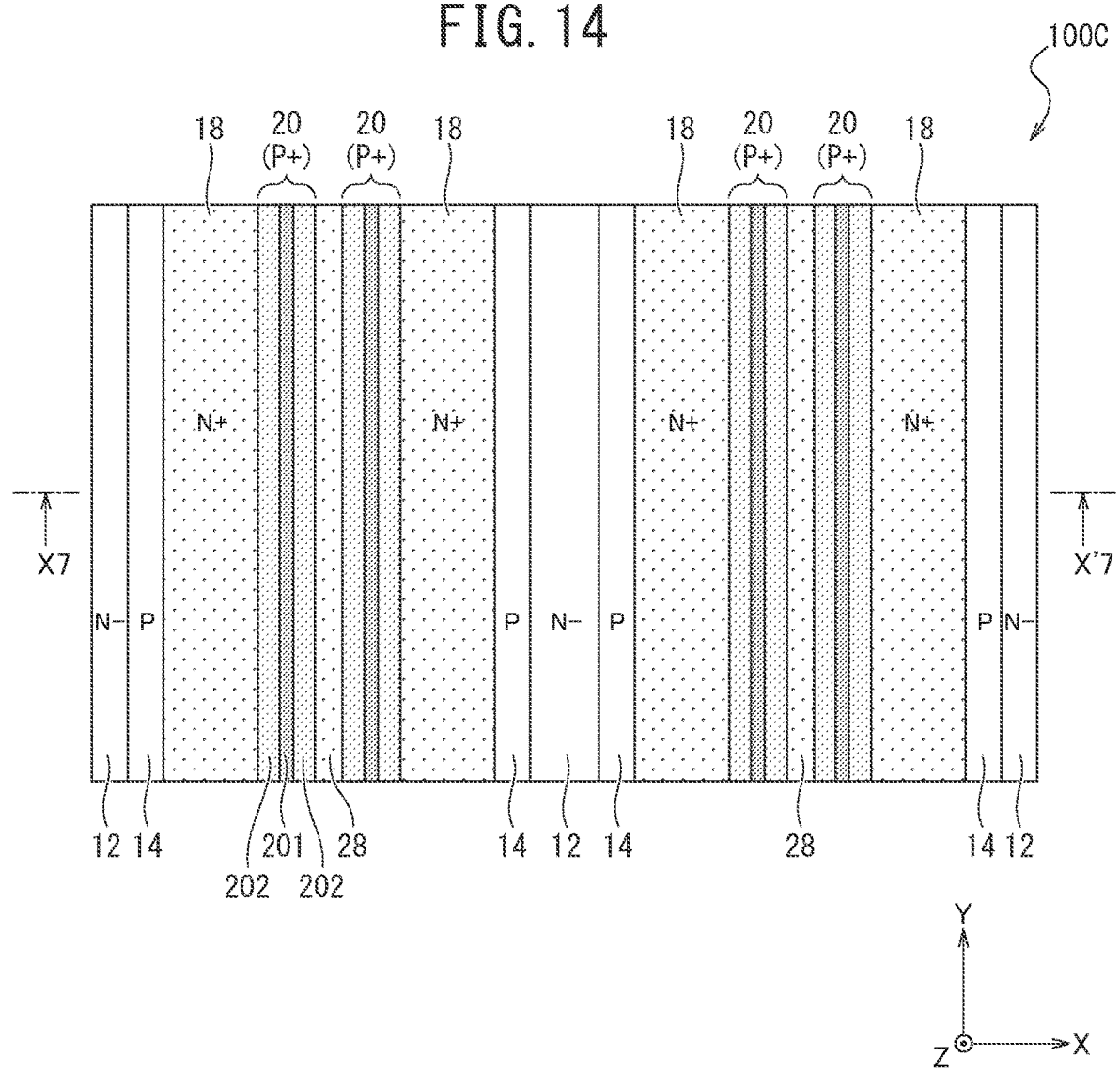
FIG. 14 is a plan view illustrative of a configuration example of a GaN semiconductor device according to a fourth embodiment of the present invention.
Figure 15:
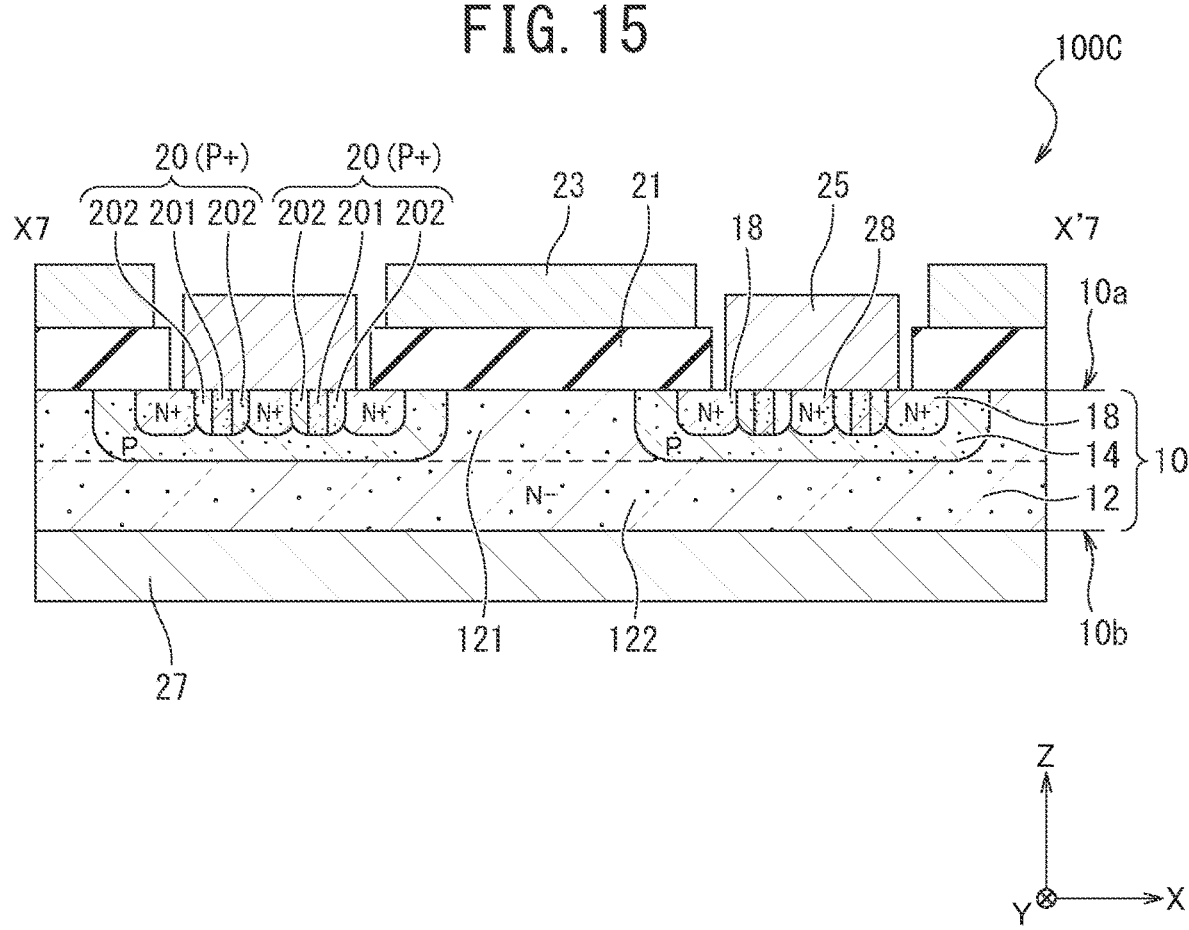
FIG. 15 is a cross-sectional view illustrative of the configuration example of the GaN semiconductor device according to the fourth embodiment of the present invention.

FIG. 14 is a plan view illustrative of a configuration example of a GaN semiconductor device 100C according to a fourth embodiment of the present invention. FIG. 15 is a cross-sectional view illustrative of the configuration example of the GaN semiconductor device 100C according to the fourth embodiment of the present invention. FIG. 15 illustrates a cross-section of the plan view in FIG. 14 taken along the line X7-X'7 thereof.

As illustrated in FIGS. 14 and 15, in the GaN semiconductor device 100C according to the fourth embodiment, two P$^+$-type regions 20 extending in the Y-axis direction are arranged under one source electrode 25. Between the two P$^+$-type regions 20, an N$^+$-type region 28 is arranged. In the X-axis direction, an N$^+$-type source region 18, a first P$^+$-type region 20, the N$^+$-type region 28, a second P$^+$-type region 20, and an N$^+$-type source region 18 are arranged in line in this order. Each of the two P$^+$-type regions 20 is sandwiched by an N$^+$-type source region 18 and the N$^+$-type region 28 on both sides. In the fourth embodiment, the N$^+$-type source regions 18 and the N$^+$-type region 28 serve as an example of "N-type regions" of the present invention.

Although concentration of a dopant element (for example, Si concentration) in the N$^+$-type regions 28 may be the same as or different from concentration of a dopant element (for example, Si concentration) in the N$^+$-type source regions 18, the concentration of the dopant element in the N$^+$-type regions 28 is a value equal to or greater than a concentration of an acceptor element (for example, Mg concentration) in the P$^+$-type regions 20. In addition, as illustrated in FIG. 15, depth of the N$^+$-type regions 28 from a front surface 10a is the same depth as depth of the P$^+$-type regions 20 from the front surface 10a.

In the GaN semiconductor device 100C according to the fourth embodiment, as with the GaN semiconductor device 100 according to the first embodiment, it is possible to achieve highly concentrated P$^+$-type regions 20 in each of which segregation of Mg is suppressed in a second region 202 adjacent to an N$^+$-type source region 18. In addition, in the GaN semiconductor device 100C, in second regions 202 adjacent to an N$^+$-type region 28 but not to N$^+$-type source regions 18, Mg segregation is also suppressed and decrease in Mg concentration is suppressed. This configuration enables second regions 202 to be formed in both side portions of each of a plurality of P$^+$-type regions 20 even when the plurality of P$^+$-type regions 20 are arranged under a source electrode 25, and it becomes possible to achieve high concentration in each of the plurality of P$^+$-type regions 20.

Note that, although, in FIG. 14, a case where an N$^+$-type source region 18 and an N$^+$-type region 28 are not connected as viewed in plan is illustrated, the case is only an example. In the fourth embodiment of the present invention, an N$^+$-type source region 18 and an N$^+$-type region 28 may be connected as viewed in plan.

In addition, although, in the fourth embodiment, a mode in which two P$^+$-type regions 20 extending in the Y-axis direction are arranged under one source electrode 25 was exemplified, the mode is only an example. In the fourth embodiment, three or more P$^+$-type regions 20 extending in the Y-axis direction may be arranged under one source electrode 25. In such a case, arranging an N$^+$-type region 28 between one and the other of a pair of P$^+$-type regions 20 that are adjacent to each other in the X-axis direction also enables high concentration to be achieved in each of the three or more P$^+$-type region 20.

Fifth Embodiment

Figure 17A:
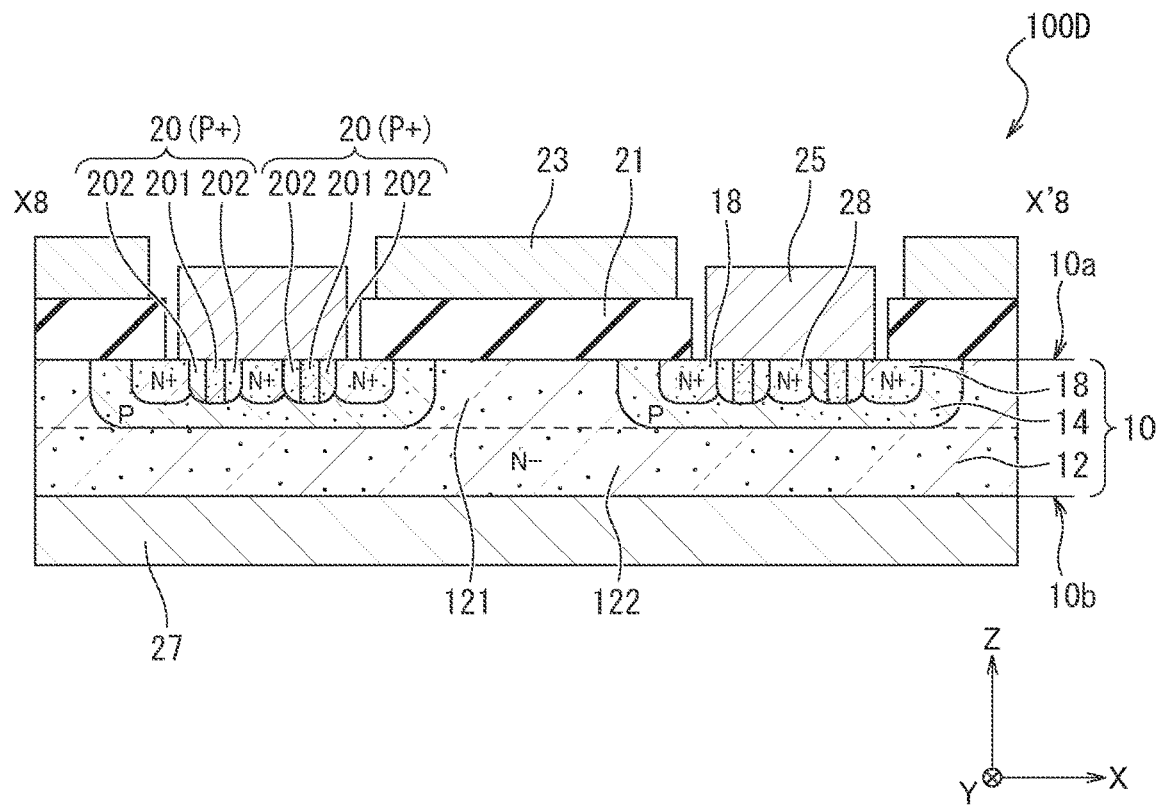
FIG. 17A is a cross-sectional view illustrative of the configuration example of the GaN semiconductor device according to the fifth embodiment of the present invention.
Figure 17B:
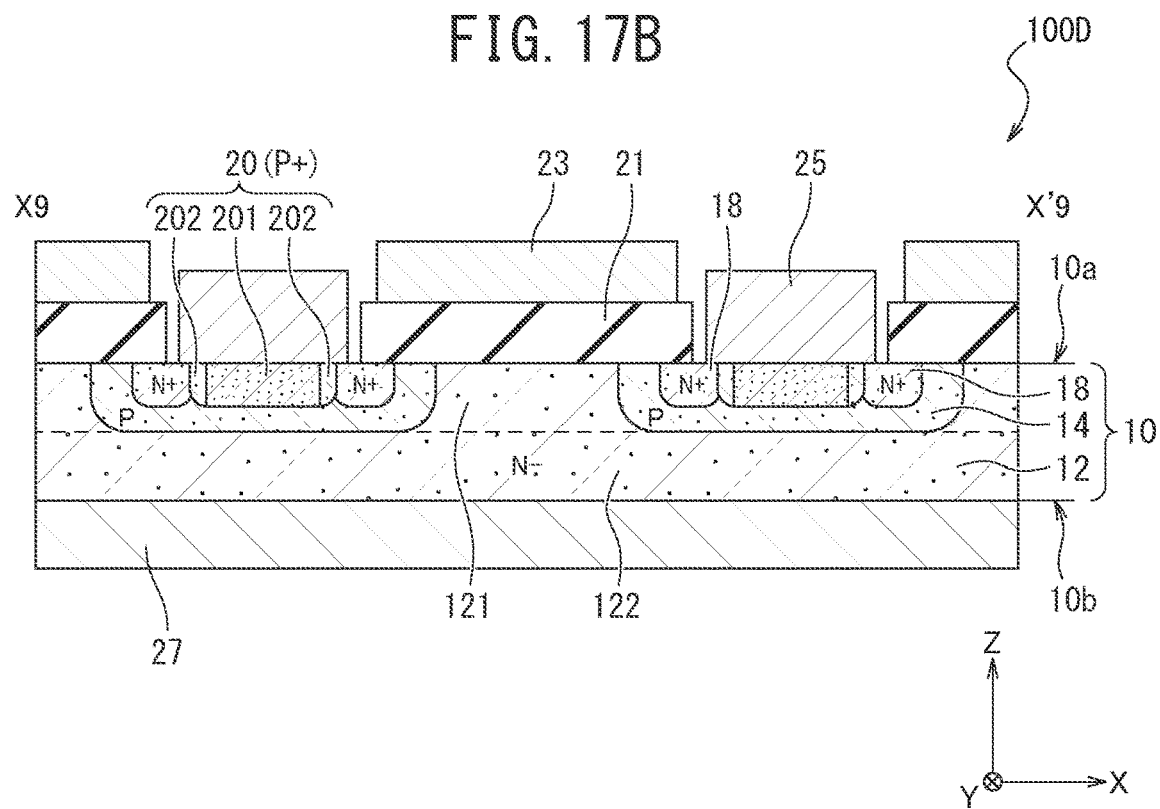
FIG. 17B is another cross-sectional view illustrative of the configuration example of the GaN semiconductor device according to the fifth embodiment of the present invention.

FIG. 16 is a plan view illustrative of a configuration example of a GaN semiconductor device 100D according to a fifth embodiment of the present invention. FIGS. 17A and 17B are cross-sectional views illustrative of the configuration example of the GaN semiconductor device 100D according to the fifth embodiment of the present invention. FIG. 17A illustrates a cross-section of the plan view in FIG. 16 taken along the line X8-X'8 thereof. FIG. 17B illustrates a cross-section of the plan view in FIG. 16 taken along the line X9-X'9 thereof.

As illustrated in FIG. 16, in the GaN semiconductor device 100D according to the fifth embodiment, N$^+$-type regions 28 are scattered in each P$^+$-type region 20 as viewed in plan. As illustrated in FIGS. 16, 17A, and 17B, each of the P$^+$-type regions 20 is sandwiched by N$^+$-type source regions 18 on both sides in the X-axis direction. In addition, a portion of each of the P$^+$-type regions 20 is in contact with one of the N$^+$-type regions 28, which are scattered in the P$^+$-type region 20, and is sandwiched by the N$^+$-type region 28 and another N$^+$-type region 28 (or by the N$^+$-type region 28 and an N$^+$-type source region 18) on both sides. In the X-axis direction, an interval between an N$^+$-type source region 18 and an N$^+$-type region 28 is the same as the interval W illustrated in FIG. 2B and, for example, 50 nm or more and 500 nm or less.

In the fifth embodiment, as with the fourth embodiment, although concentration of a dopant element (for example, Si concentration) in the N$^+$-type regions 28 may be the same as or different from concentration of a dopant element (for example, Si concentration) in the N$^+$-type source regions 18, the concentration of the dopant element in the N$^+$-type regions 28 is a value equal to or greater than a concentration of an acceptor element (for example, Mg concentration) in the P$^+$-type regions 20. In addition, as illustrated in FIG. 17A, depth of the N$^+$-type regions 28 from a front surface 10a is the same depth as depth of the P$^+$-type regions 20 from the front surface 10a.

A depletion layer extends from an N$^+$-type region 28 to a P$^+$-type region 20. Because of this configuration, in a P$^+$-type region 20, a second region 202 that has higher concentration of acceptors (for example, Mg concentration) than a first region 201 is formed in not only a region adjacent to an N$^+$-type source region 18 but also a region adjacent to an N$^+$-type region 28.

In the GaN semiconductor device 100D according to the fifth embodiment, as with the GaN semiconductor device 100 according to the first embodiment, it is possible to achieve highly concentrated P$^+$-type regions 20 in each of which segregation of Mg is suppressed in a second region 202 adjacent to an N$^+$-type source region 18. In addition, in the GaN semiconductor device 100D, in second regions 202 adjacent to an N$^+$-type region 28 but not to N$^+$-type source regions 18, Mg segregation is also suppressed and decrease in Mg concentration is suppressed. Because of this configuration, in the GaN semiconductor device 100D, since it is possible to increase a ratio of an activation area within a P$^+$-type region 20 (that is, a ratio of area of a second region 202), it becomes possible to achieve a more highly concentrated P$^+$-type region 20.

Note that, although, in FIG. 16, a case where an N$^+$-type source region 18 and an N$^+$-type region 28 are not connected as viewed in plan is illustrated, the case is only an example. In the fifth embodiment of the present invention, an N$^+$-type source region 18 and an N$^+$-type region 28 may be connected as viewed in plan.

In addition, each of the dot-shaped N$^+$-type regions 28 is only required to be surrounded by a P$^+$-type region 20 as viewed in plan and may be arranged at any position. In addition, although, in FIG. 16, a case where each of the dot-shaped N$^+$-type regions 28 is a square as viewed in plan is illustrated, the case is only an example. Each of the dot-shaped N$^+$-type regions 28 may be a rectangle or a circle as viewed in plan.

Sixth Embodiment

In the above-described first to fifth embodiments, a case where vertical MOSFETs that a GaN semiconductor device includes are planar was described. However, in an embodiment of the present invention, vertical MOSFETs that a GaN semiconductor device includes are not limited to the planar type MOSFETs and may be trench gate type MOSFETs.

Figure 18:
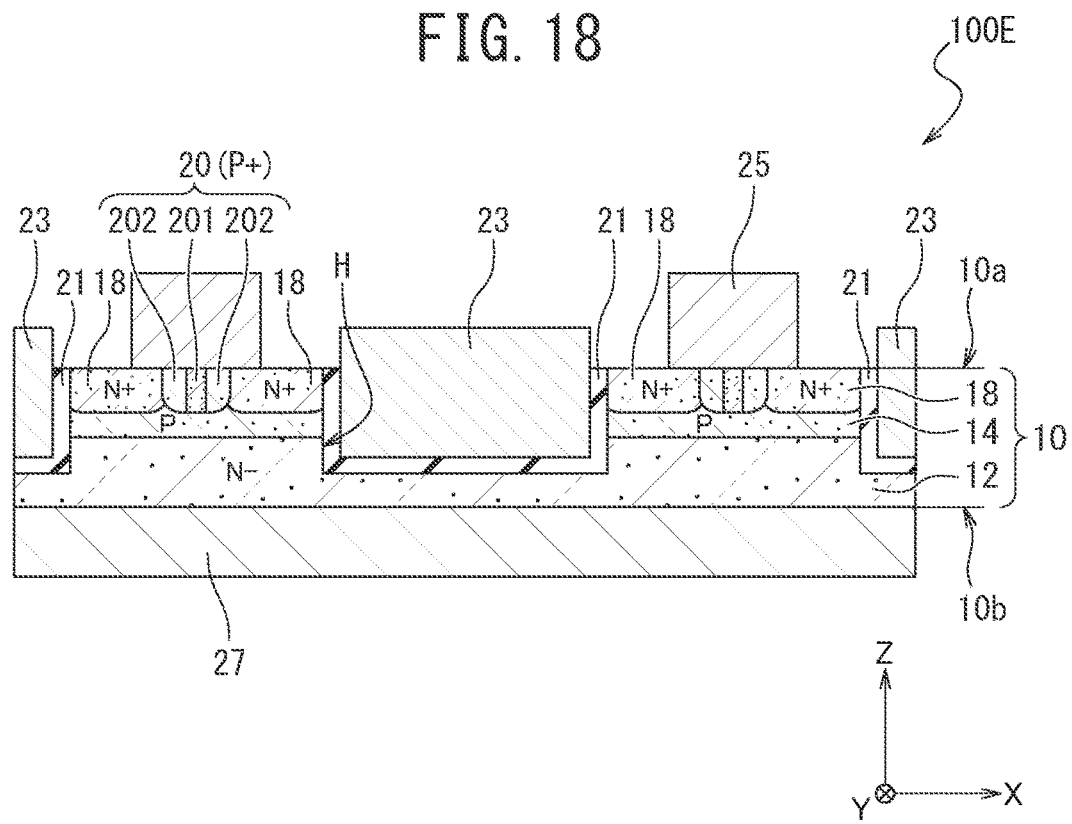
FIG. 18 is a cross-sectional view illustrative of a configuration example of a GaN semiconductor device according to a sixth embodiment of the present invention.

FIG. 18 is a cross-sectional view illustrative of a configuration example of a GaN semiconductor device 100E according to a sixth embodiment of the present invention. As illustrated in FIG. 18, the GaN semiconductor device 100E according to the sixth embodiment has trenches H formed on a GaN substrate 10. The trenches H open on the front surface 10a side of the GaN substrate 10. The trenches H are formed deeper than P-type well regions 14, and bottom portions of the trenches H reach an N$^-$-type drift region 12.

On the inside of each of the trenches H, a gate insulating film 21 and a gate electrode 23 are arranged. The side surfaces and the bottom surface on the inside of the trench H are covered by the gate insulating film 21. In addition, the gate electrode 23 is embedded in the trench H with the gate insulating film 21 interposed therebetween. In a trench gate structure, a region that is within a well region 14 and that faces a gate electrode 23 with a gate insulating film 21 interposed therebetween serves as a channel region of a vertical MOSFET.

In the GaN semiconductor device 100E according to the sixth embodiment, as with the GaN semiconductor device 100 according to the first embodiment, it is possible to achieve highly concentrated P$^+$-type regions 20. In addition, employing the trench gate structure for vertical MOSFETs enables channel regions to be arranged more closely, which facilitates miniaturization of elements.

Seventh Embodiment

The present invention may be applied to a diode.

Figure 19:
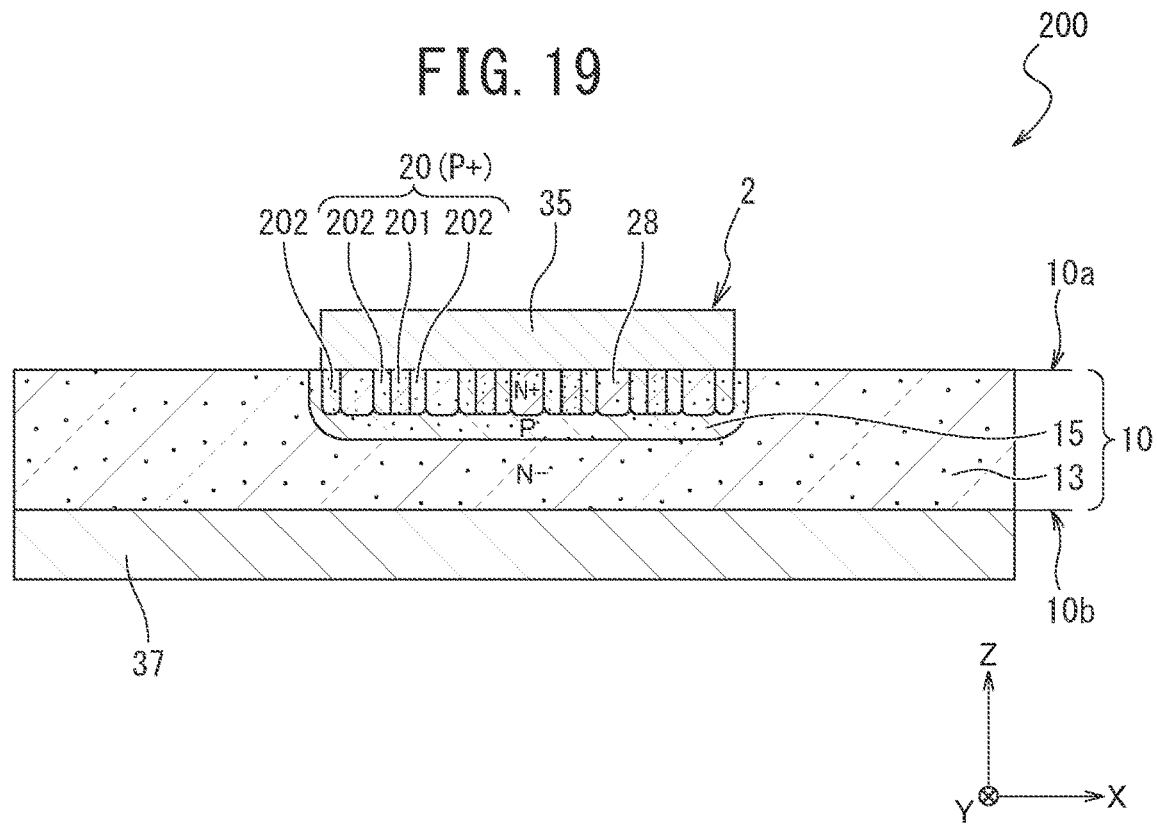
FIG. 19 is a cross-sectional view illustrative of a configuration example of a GaN semiconductor device according to a seventh embodiment of the present invention.

FIG. 19 is a cross-sectional view illustrative of a configuration example of a GaN semiconductor device 200 according to a seventh embodiment of the present invention. As illustrated in FIG. 19, the GaN semiconductor device 200 according to the seventh embodiment includes a GaN substrate 10 and one or more PN diodes 2 that are formed in the GaN substrate 10.

Each of the PN diodes 2 includes an N$^-$-type region 13 that is formed in the GaN substrate 10, a P-type region 15 that is formed in the GaN substrate 10 and that is in contact with the N$^-$-type region 13, P$^+$-type regions 20 that are formed in the GaN substrate 10 and that are in contact with the P-type region 15, N$^+$-type regions 28 (an example of an "N-type region" of the present invention) that are formed in the GaN substrate 10 and that are in contact with the P-type region 15 and the P$^+$-type regions 20, an anode electrode 35 (an example of an "electrode" of the present invention) that are formed on the front surface 10a side of the GaN substrate 10 and that is in contact with the P$^+$-type regions 20 and the N$^+$-type regions 28, and a cathode electrode 37 that is formed on the back surface 10b side of the GaN substrate 10 and that is in contact with the N$^-$-type region 13. The P-type region 15 and the P$^+$-type regions 20 are an anode region of the PN diode 2. The N$^-$-type region 13 is a cathode region of the PN diode 2.

The P-type regions 15 are formed by ions of an acceptor element being implanted into the N-type GaN substrate 10 and the GaN substrate 10 being heat-treated. The acceptor element is, for example, Mg.

The anode electrodes 35 and the cathode electrode 37 are made of, for example, Al or an alloy of Al—Si. Barrier metal layers may be respectively interposed between the anode electrodes 35 and the GaN substrate 10 and between the cathode electrode 37 and the GaN substrate 10. Ti may be used as a material of the barrier metal layers.

As illustrated in FIG. 19, P$^+$-type regions 20 and N$^+$-type regions 28 are alternately arranged in line in the X-axis direction. Because of this configuration, in each P$^+$-type region 20, depletion layers extend from N$^+$-type regions 28 and second regions 202 that have higher concentration of an acceptor element (for example, Mg concentration) than a first region 201 are formed.

In the GaN semiconductor device 200 according to the seventh embodiment, it is possible to achieve highly concentrated P$^+$-type regions 20 in each of which segregation of Mg is suppressed in the second regions 202 adjacent to N$^+$-type regions 28. In addition, connecting the anode electrodes 35 to the highly concentrated P$^+$-type regions 20 enables an anode contact with excellent ohmic characteristics to be achieved between the P$^+$-type regions 20 and the anode electrodes 35.

Eighth Embodiment

Figure 20:
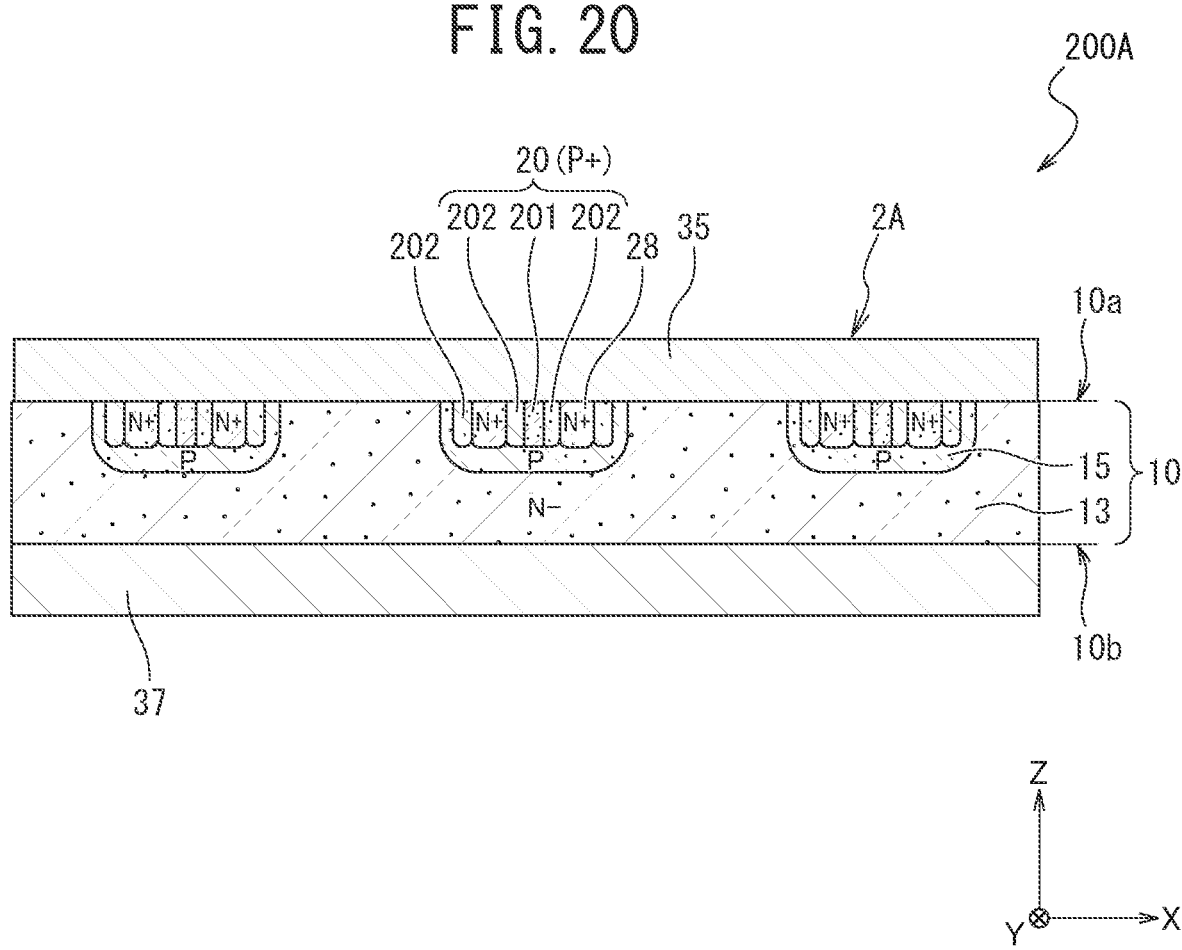
FIG. 20 is a cross-sectional view illustrative of a configuration example of a GaN semiconductor device according to an eighth embodiment of the present invention.

FIG. 20 is a cross-sectional view illustrative of a configuration example of a GaN semiconductor device 200A according to an eighth embodiment of the present invention. As illustrated in FIG. 20, the GaN semiconductor device 200A according to the eighth embodiment includes a GaN substrate 10 and a merged PiN Schottky (MPS) diode 2A that is formed in the GaN substrate 10. The MPS diode 2A is an element that is formed by combining a PN diode and a Schottky diode.

The MPS diode 2A includes an N$^-$-type region 13 that is formed in the GaN substrate 10, a plurality of P-type regions 15 that are formed in the GaN substrate 10 and that are in contact with the N$^-$-type region 13, P$^+$-type regions 20 that are formed in the GaN substrate 10 and that are in contact with the P-type regions 15, N$^+$-type regions 28 that are formed in the GaN substrate 10 and that are in contact with the P-type regions 15 and the P$^+$-type regions 20, an anode electrode 35 that is formed on the front surface 10a side of the GaN substrate 10 and that is in contact with the N$^-$-type region 13, the P-type regions 15, the P$^+$-type regions 20, and the N$^+$-type regions 28, and a cathode electrode 37 that is formed on the back surface 10b side of the GaN substrate 10 and that is in contact with the N$^-$-type region 13.

As illustrated in FIG. 20, the plurality of P-type regions 15 are arranged separated from each other. Between one and the other of a pair of P-type regions 15 that are adjacent to each other, the N$^-$-type region 13 is arranged. Connection between the anode electrode 35 and the P$^+$-type regions 20 and connection between the N$^-$-type region 13 and the cathode electrode 37 are respectively ohmic connection. A PN diode is constituted by the anode electrode 35, the P$^+$-type regions 20, the P-type regions 15, the N$^-$-type region 13, and the cathode electrode 37. The P-type regions 15 and the P$^+$-type regions 20 are an anode region of the PN diode. The N$^-$-type region 13 is a cathode region of the PN diode.

In addition, connection between the anode electrode 35 and the N$^-$-type region 13 is a Schottky connection. A Schottky diode is constituted by the anode electrode 35, the N$^-$-type region 13, and the cathode electrode 37.

A material of which the anode electrode 35 is made and a material of which the cathode electrode 37 is made may be the same material as each other or materials different from each other. For example, the anode electrode 35 is made of any one material of nickel (Ni), platinum (Pt), and palladium (Pd). The cathode electrode 37 is made of Al, an alloy of Al—Si, or titanium (Ti).

As illustrated in FIG. 20, in the MPS diode 2A, P$^+$-type regions 20 and N$^+$-type regions 28 are also alternately arranged in line in the X-axis direction. Because of this configuration, in each P$^+$-type region 20, depletion layers extend from N$^+$-type regions 28 and second regions 202 that have higher concentration of an acceptor element (for example, Mg concentration) than a first region 201 are formed.

In the GaN semiconductor device 200A according to the eighth embodiment, as with the GaN semiconductor device 200 according to the seventh embodiment, it is possible to achieve highly concentrated P$^+$-type regions 20 in each of which segregation of Mg is suppressed in the second regions 202 adjacent to N$^+$-type source regions 28. In addition, joining the anode electrode 35 to the highly concentrated P$^+$-type regions 20 enables an anode contact with excellent ohmic characteristics to be achieved between the P$^+$-type regions 20 and the anode electrode 35.

Other Embodiments

As described above, the present invention was described through the embodiments and variations, but the statements and drawings constituting a portion of this disclosure should not be construed as a limitation of the present invention. Various alternative embodiments and variations will be made obvious to those skilled in the art by the disclosure.

For example, in the present invention, the vertical MOSFETs in the GaN semiconductor devices 100A to 100D described in the second to fifth embodiments may have a trench gate type structure as described in the sixth embodiment instead of a planar type structure.

In addition, a P$^+$-type region 20 may be included in, instead of a vertical MOSFET in which current flows in the vertical direction of the GaN substrate 10, a lateral MOSFET in which current flows in the horizontal direction of the GaN substrate 10.

In addition, the gate insulating film 21 is not limited to a SiO$_2$ film and may be another type of insulating film. As the gate insulating film 21, a silicon oxynitride (SiON) film, a strontium oxide (SrO) film, a silicon nitride (Si$_3$N$_4$) film, or an aluminum oxide (Al$_2$O$_3$) film can be used. In addition, as the gate insulating film 21, a composite film formed by stacking some single layer insulating films, or the like can be used. A vertical MOSFET in which an insulating film other than a SiO$_2$ film is used as the gate insulating film 21 may be referred to as a vertical MISFET. The MISFET means more inclusive insulated gate type transistors including MOSFETs.

In addition, in the above-described first to sixth embodiments, it was described that an electrode in contact with the P$^+$-type region 20 was a source electrode 25. In the above-described seventh and eighth embodiments, it was described that an electrode in contact with the P$^+$-type regions 20 was the anode electrode 35. However, the embodiments in the present invention is not limited to the above description. The P$^+$-type region 20 may be in contact with an electrode other than a source electrode and an anode electrode. In addition, a P-type region exemplified by the P$^+$-type region 20 may be included in an element other than a MISFET and a PN diode, and may be included in, for example, a bipolar transistor, a capacitance element, or a resistance element.

As described above, it is needless to say that the present technology includes various embodiments and the like that are not described herein. At least one of various kinds of omission, replacement, and modification of the constituent elements can be performed without departing from the gist of the above-described embodiments and variation. Advantageous effects described herein are only exemplifications and are not specifically limited, and other advantageous effects may be achieved.

REFERENCE SIGNS LIST

1 Vertical MOSFET
2 PN diode
2A MPS diode
10 GaN substrate
10a Front surface
10b Back surface
12 Drift region 13 N⁻-type region
14 Well region
14' Well formation region
15 P-type region
18 N⁺-type source region
18' Source formation region
20 P⁺-type region
20' P⁺-type formation region
20X Second portion
20Y First portion
21 Gate insulating film
23 Gate electrode
25 Source electrode
27 Drain electrode
28 N⁺-type region
35 Anode electrode
37 Cathode electrode
51 Mask
53 Protective film
100, 100A, 100B, 100C, 100D, 100E, 200, 200A GaN semiconductor device
110 Active region
112 Gate pad
114 Source pad
121 Upper region
122 Lower region
130 Edge termination region
201 First region
202 Second region
D Drain terminal
G Gate terminal
S Source terminal

The invention claimed is:

1. A method for manufacturing a nitride semiconductor device comprising:
   forming N-type regions in a nitride semiconductor layer;
   implanting ions of an acceptor element into a region sandwiched by the N-type regions on both sides in the nitride semiconductor layer; and
   forming a P-type region sandwiched by the N-type regions on both sides by subjecting the nitride semiconductor layer in which the N-type regions are formed and into which ions of the acceptor element are implanted to heat treatment and activating the acceptor element,
   wherein, in the forming the N-type regions,
   the method implants ions of a donor element to the nitride semiconductor layer at a high concentration in such a way that concentration of the donor element in the N-type regions has a value equal to or greater than concentration of the acceptor element in the P-type region, and
   in the implanting ions of the acceptor element,
   the method implants ions of the acceptor element in such a way that:
      concentration of the acceptor element in the P-type region is $1\times10^{19}$ cm$^{-3}$ or more and $1\times10^{21}$ cm$^{-3}$ or less; and
      a region into which the ions of the acceptor element is implanted partially overlaps the N-type regions adjacent to the P-type region, and
      the P-type region includes:
         a first region; and
         second regions each of which is located between the first region and one of the N-type regions and is respectively in contact with the first region and the N-type region, wherein
      concentration of the acceptor element in the second regions is higher than in the first region, and
      concentration of the acceptor element in the second regions is $1\times10^{19}$ cm$^{-3}$ or more and $1\times10^{21}$ cm$^{-3}$ or less.

2. The method for manufacturing the nitride semiconductor device according to claim 1, wherein a maximum temperature of the heat treatment is 1300° C. or more and 2000° C. or less.

3. A nitride semiconductor device comprising:
   a nitride semiconductor layer;
   N-type regions formed on one surface side of the nitride semiconductor layer; and
   a P-type region formed on the one surface side of the nitride semiconductor layer and sandwiched by the N-type regions on both sides,
   wherein:
      concentration of a donor element in the N-type regions has a value equal to or greater than concentration of an acceptor element in the P-type region, and
      concentration of the acceptor element in at least a portion of the P-type region is $1\times10^{19}$ cm$^{-3}$ or more and $1\times10^{21}$ cm$^{-3}$ or less,
      the N-type regions have a portion with low concentration of the donor element adjacent to the P-type region, and
      the P-type region includes:
         a first region; and
         second regions each of which is located between the first region and one of the N-type regions and is respectively in contact with the first region and the N-type region, wherein
      concentration of the acceptor element in the second regions is higher than in the first region, and
      concentration of the acceptor element in the second regions is $1\times10^{19}$ cm$^{-3}$ or more and $1\times10^{21}$ cm$^{-3}$ or less.

4. The nitride semiconductor device according to claim 3, wherein an interval between portions within the N-type regions, the portions sandwiching the P-type region on both sides, is 50 nm or more and 500 nm or less.

5. The nitride semiconductor device according to claim 3, wherein depth of the N-type regions from the one surface and depth of the P-type region from the one surface are same depth as each other.

6. The nitride semiconductor device according to claim 3, wherein the nitride semiconductor layer is gallium nitride.

7. The nitride semiconductor device according to claim 3, wherein the acceptor elements include at least either magnesium or beryllium.

8. The nitride semiconductor device according to claim 3, wherein density of acceptor segregation in the second regions is lower than density of the acceptor segregation in the first region.

9. The nitride semiconductor device according to claim 8, wherein
   when the acceptor segregation is classified into:
      rod-like acceptor segregation having a length in one direction of 30 nm or more and a concentration of the acceptor element of $5\times10^{20}$ cm$^{-3}$ or more; and
      non-rod-like acceptor segregation having a length in one direction of less than 30 nm and a concentration of the acceptor element of $5\times10^{20}$ cm$^{-3}$ or more,
   in the second regions, density of the rod-like acceptor segregation is equal to or less than $1\times10^{14}$ cm$^{-3}$, and density of the non-rod-like acceptor segregation is less than $1\times10^{15}$ cm$^{-3}$.

10. The nitride semiconductor device according to claim 3, wherein length of each of the second regions in a direction in which the N-type regions sandwich the P-type region on both sides is 1 nm or more and 25 nm or less.

11. The nitride semiconductor device according to claim 3 further comprising an electrode formed on the P-type region.

12. The nitride semiconductor device according to claim 3 comprising:
- a P-type well region formed in the nitride semiconductor layer; and
- a field effect transistor formed in the nitride semiconductor layer and having a channel formed in the well region,
- wherein the P-type region has a higher concentration of the acceptor element than the well region and is in contact with the well region.

13. The nitride semiconductor device according to claim 3 comprising
- a diode formed in the nitride semiconductor layer,
- wherein the P-type region is included in an anode region of the diode.

\* \* \* \* \*